(12) United States Patent
Cho et al.

(10) Patent No.: US 11,411,044 B2
(45) Date of Patent: Aug. 9, 2022

(54) DISPLAY DEVICE

(71) Applicant: Samsung Display Co., Ltd., Yongin-si (KR)

(72) Inventors: Hyun Min Cho, Seoul (KR); Dae Hyun Kim, Hwaseong-si (KR); Jin Oh Kwag, Suwon-si (KR); Dong Hyun Kim, Hwaseong-si (KR); Keun Kyu Song, Seongnam-si (KR); Hyun Deok Im, Seoul (KR); Sung Chan Jo, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 611 days.

(21) Appl. No.: 16/338,449

(22) PCT Filed: Sep. 21, 2018

(86) PCT No.: PCT/KR2018/011285
§ 371 (c)(1),
(2) Date: Mar. 29, 2019

(87) PCT Pub. No.: WO2020/009274
PCT Pub. Date: Jan. 9, 2020

(65) Prior Publication Data
US 2021/0327954 A1    Oct. 21, 2021

(30) Foreign Application Priority Data

Jul. 4, 2018 (KR) .................... 10-2018-0077640

(51) Int. Cl.
*H01L 27/15*    (2006.01)
*H01L 33/38*    (2010.01)
*H01L 33/62*    (2010.01)

(52) U.S. Cl.
CPC ............ *H01L 27/156* (2013.01); *H01L 33/38* (2013.01); *H01L 33/62* (2013.01)

(58) Field of Classification Search
CPC combination set(s) only.
See application file for complete search history.

(56) References Cited

U.S. PATENT DOCUMENTS 8,547,513 B2    10/2013    Kim et al.
2006/0061524 A1    3/2006    Suh et al.
(Continued)

FOREIGN PATENT DOCUMENTS

JP    2000-29404 A    1/2000
KR    10-2006-0019758 A    3/2006
(Continued)

OTHER PUBLICATIONS

International Search Report; International Application Serial No. PCT/KR2018/011285; dated Apr. 4, 2019, 4 sheets.

*Primary Examiner* — Ratisha Mehta
(74) *Attorney, Agent, or Firm* — Lewis Roca Rothgerber Christie LLP

(57) ABSTRACT

A display device comprises a first electrode, a second electrode disposed to be spaced apart from the first electrode and face the first electrode, a first insulating layer disposed to cover the first electrode and the second electrode, a second insulating layer disposed on at least a part of the first insulating layer and exposing at a part of a region where the first electrode and the second electrode overlaps the first insulating layer and at least one light emitting element on the exposed first insulating layer between the first electrode and the second electrode, wherein the second insulating layer includes at least one opening exposing the first insulating layer and disposed to be spaced apart from each other on a region where the first electrode and the second electrode (Continued)

face each other, and a bridge portion between the openings, and the light emitting element is disposed on the opening.

20 Claims, 17 Drawing Sheets

(56) References Cited

U.S. PATENT DOCUMENTS

| | | | |
|---|---|---|---|
| 2011/0089850 A1 | 4/2011 | Shibata et al. | |
| 2011/0254043 A1 | 10/2011 | Negishi et al. | |
| 2014/0145237 A1 | 5/2014 | Do et al. | |
| 2017/0294424 A1 | 10/2017 | Jeong | |
| 2018/0175106 A1 | 6/2018 | Kim et al. | |
| 2018/0287028 A1* | 10/2018 | Chae | H01L 33/38 |
| 2019/0392751 A1* | 12/2019 | Hsieh | H01L 33/504 |

FOREIGN PATENT DOCUMENTS

| | | | |
|---|---|---|---|
| KR | 10-2007-0096212 A | 10/2007 | |
| KR | 10-2010-0000721 A | 1/2010 | |
| KR | 10-2012-0014866 A | 2/2012 | |
| KR | 10-2012-0122159 A | 11/2012 | |
| KR | 10-2012-0122645 A | 11/2012 | |
| KR | 10-2015-0006798 A | 1/2015 | |
| KR | 10-2017-0074410 A | 6/2017 | |

* cited by examiner

[Fig. 3]

[Fig. 6]
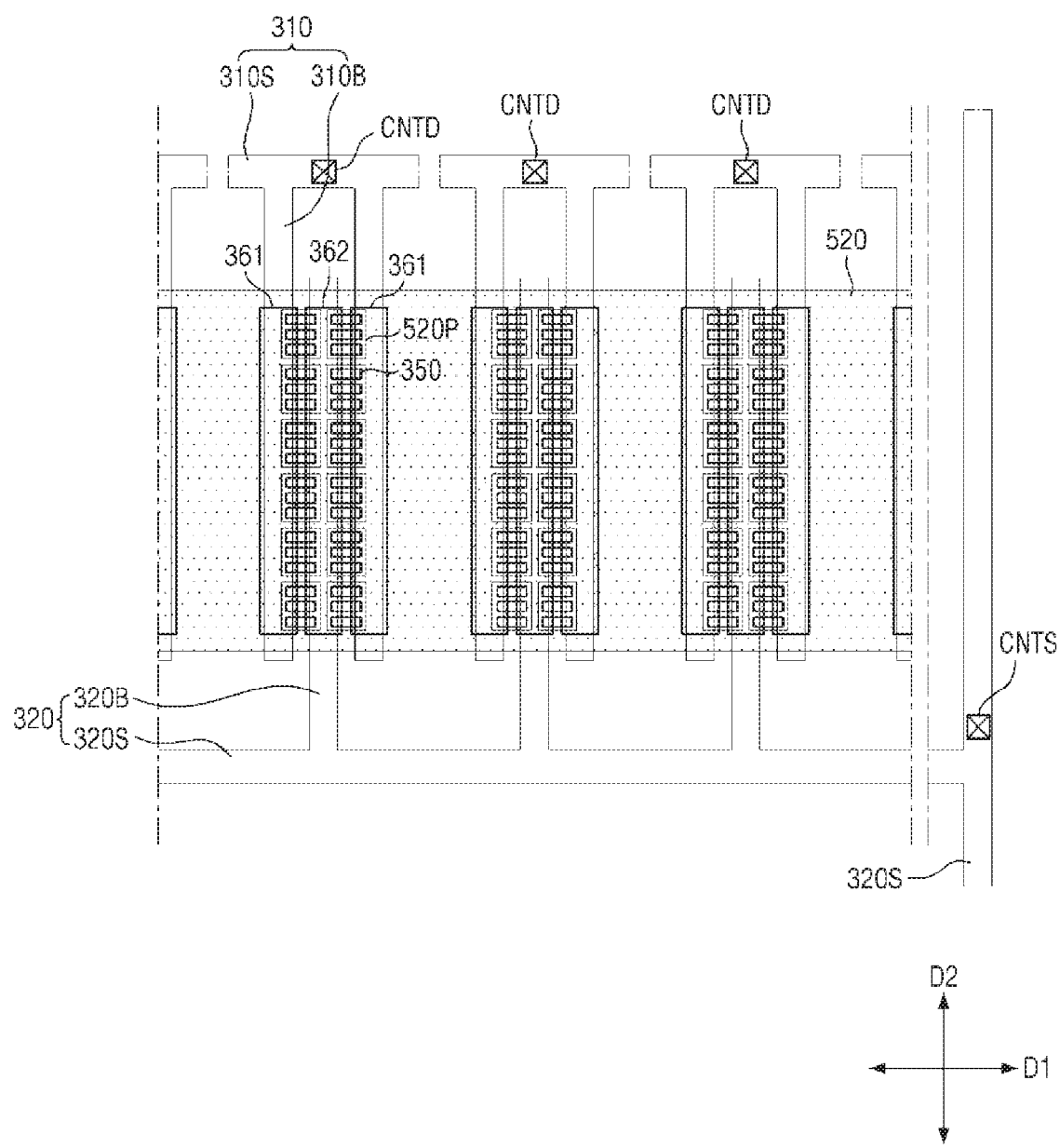

[Fig. 7]
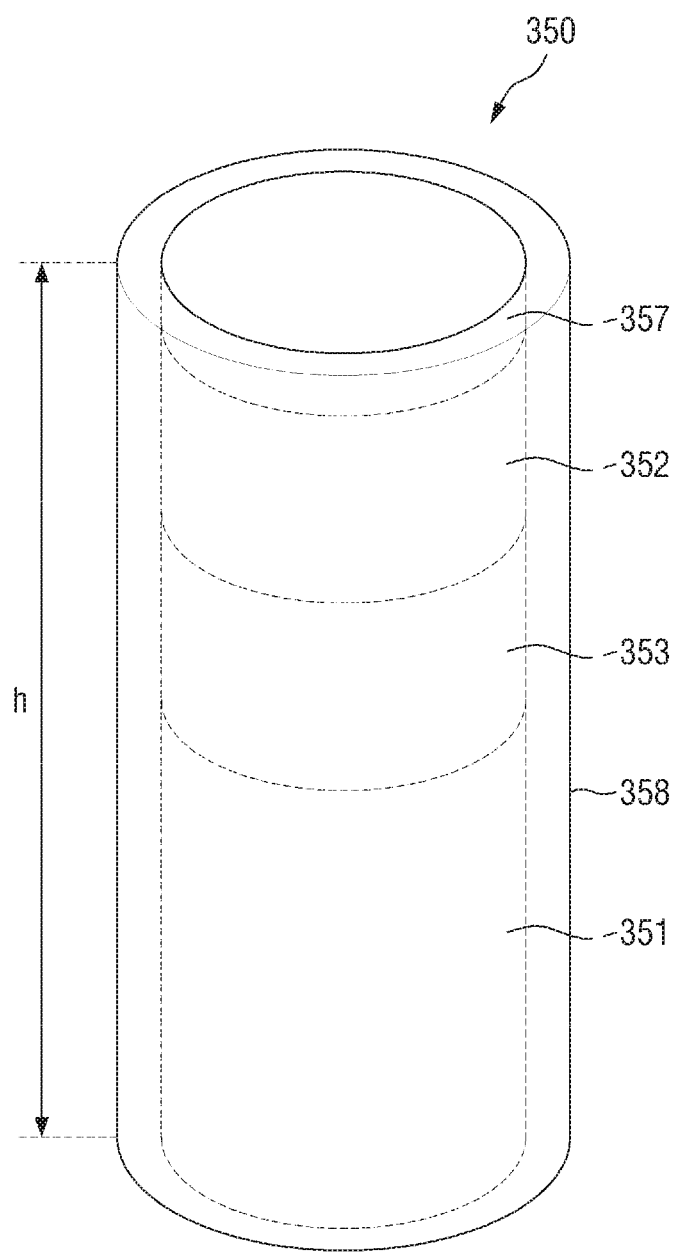

[Fig. 8]
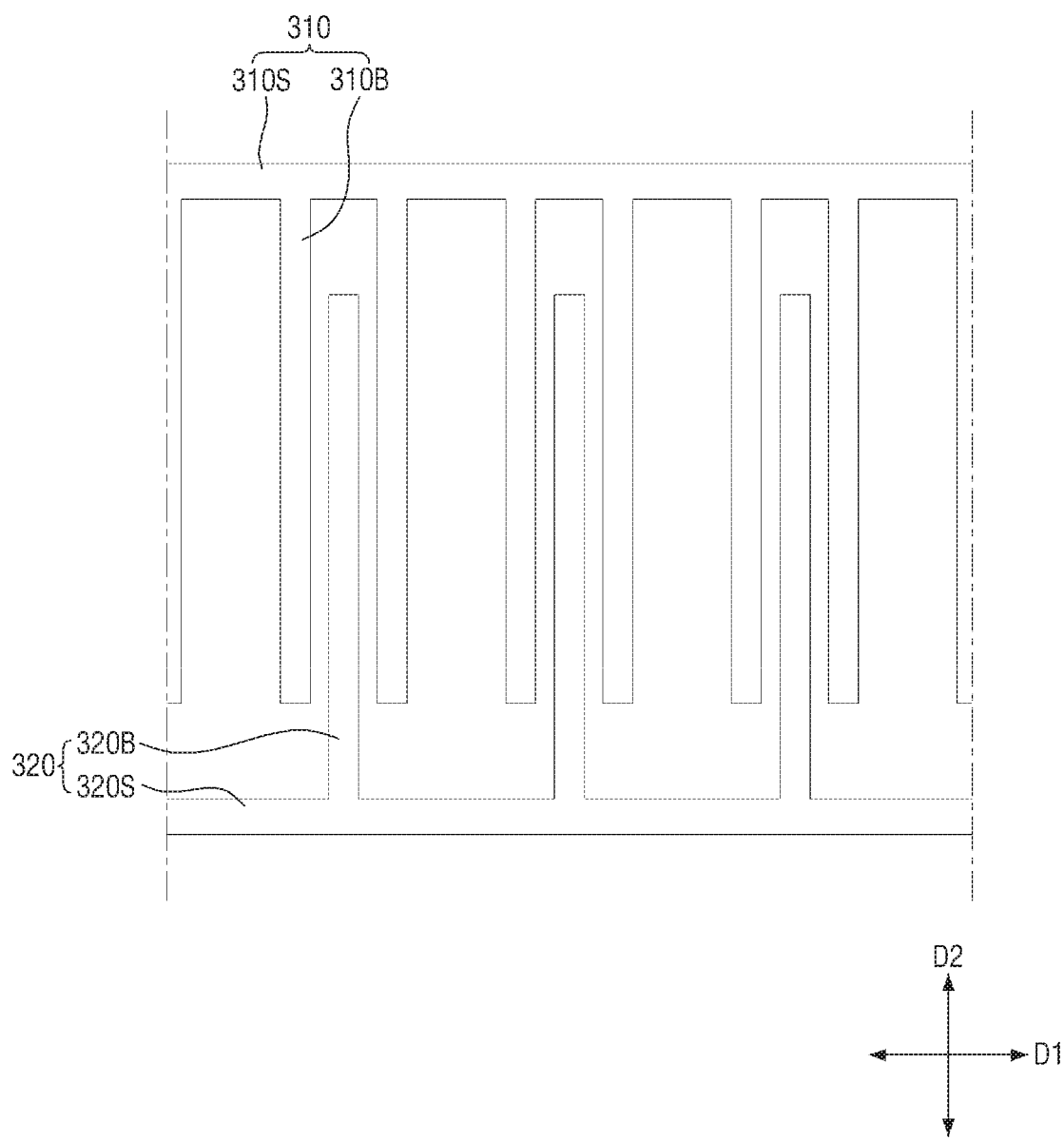

[Fig. 9]
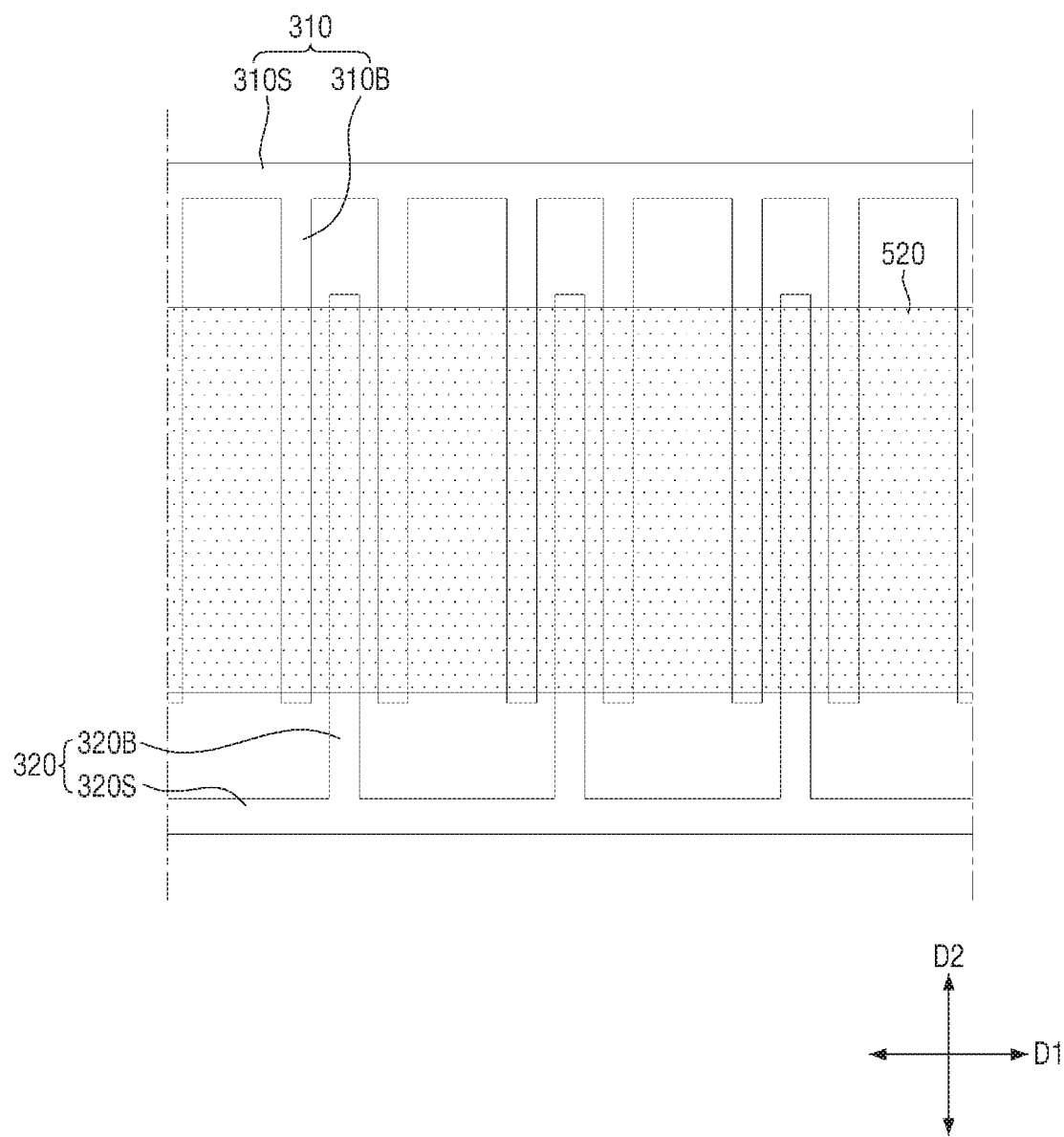

[Fig. 10]
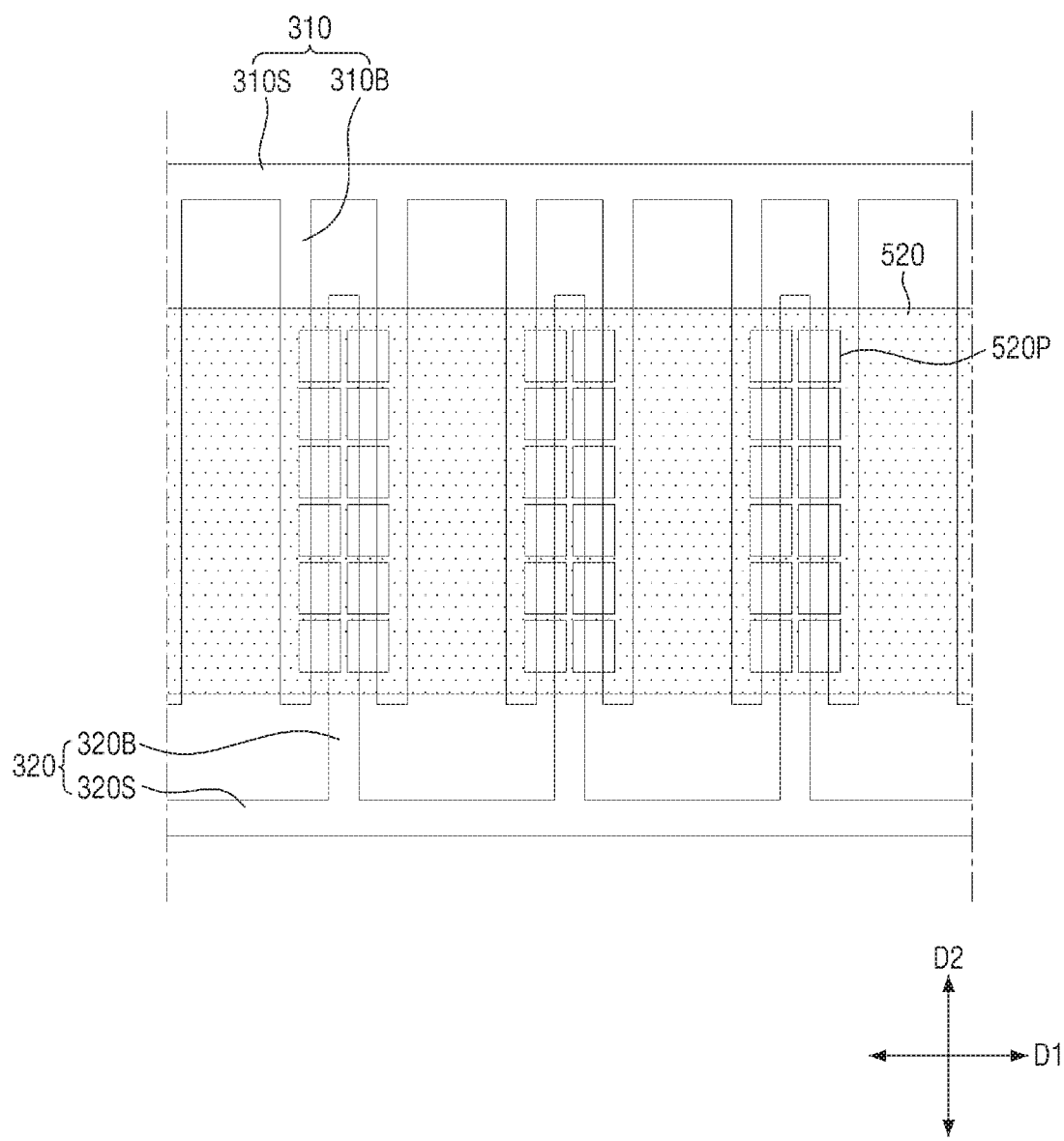

[Fig. 11]
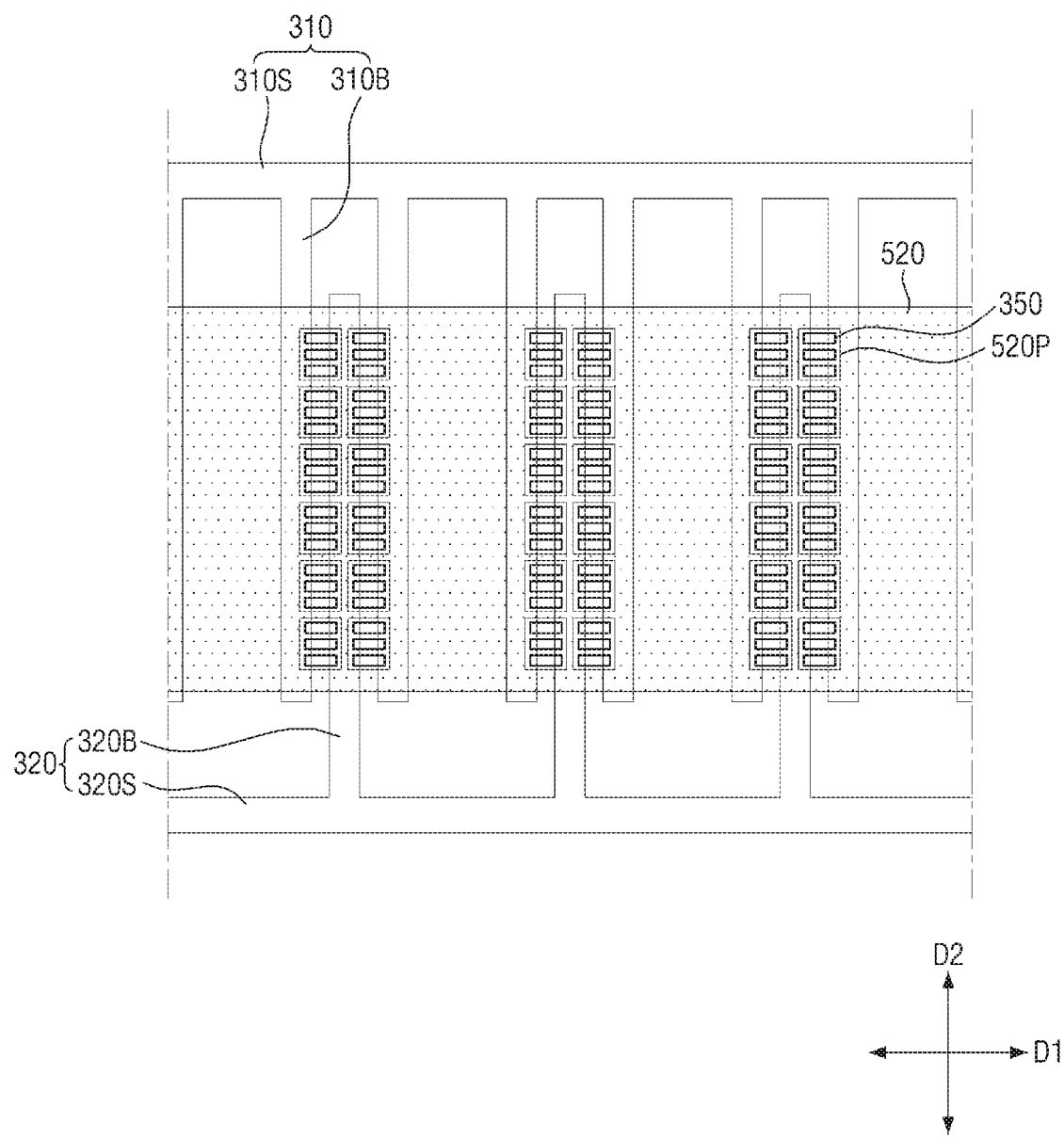

[Fig. 12]
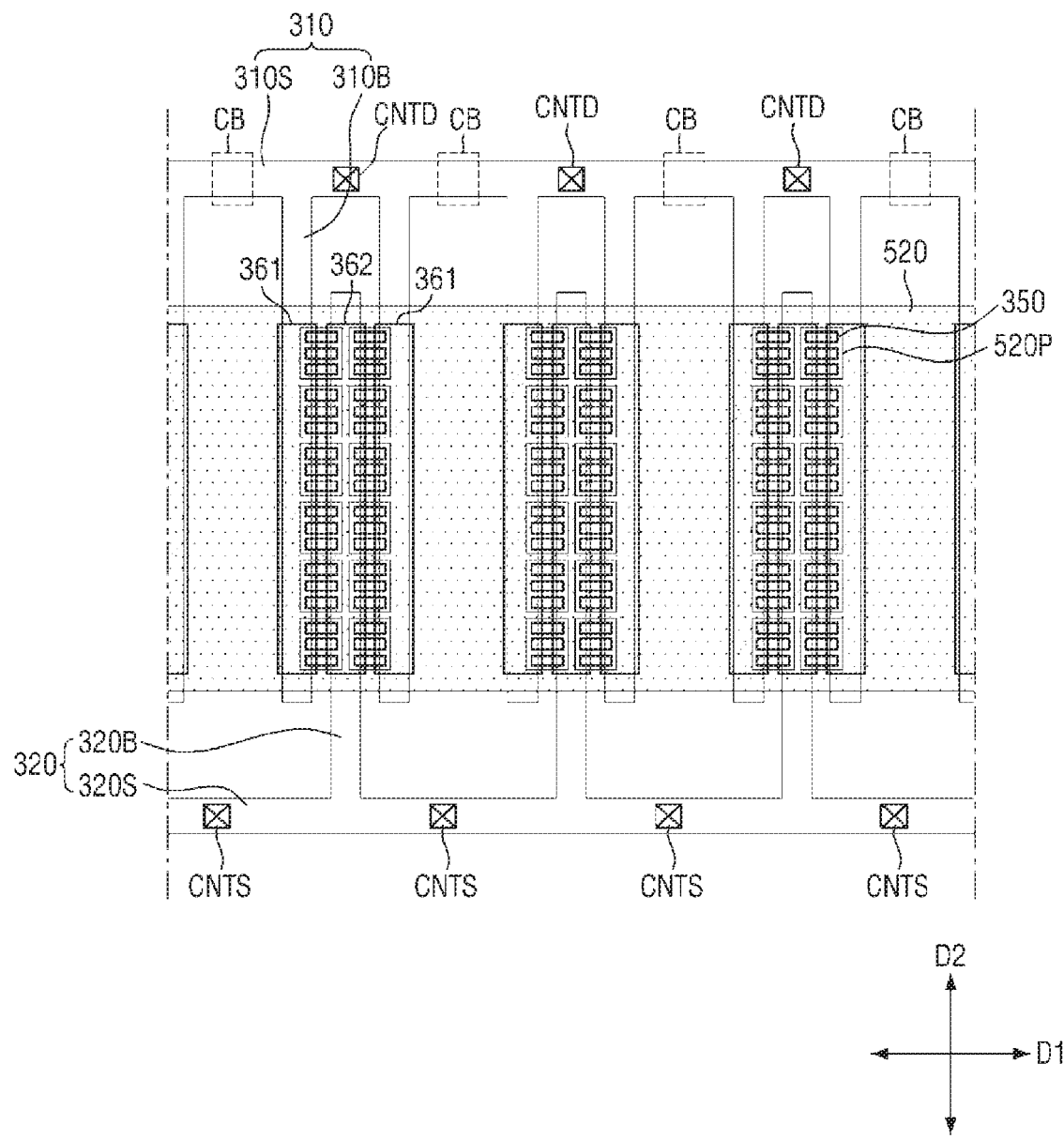

[Fig. 13]
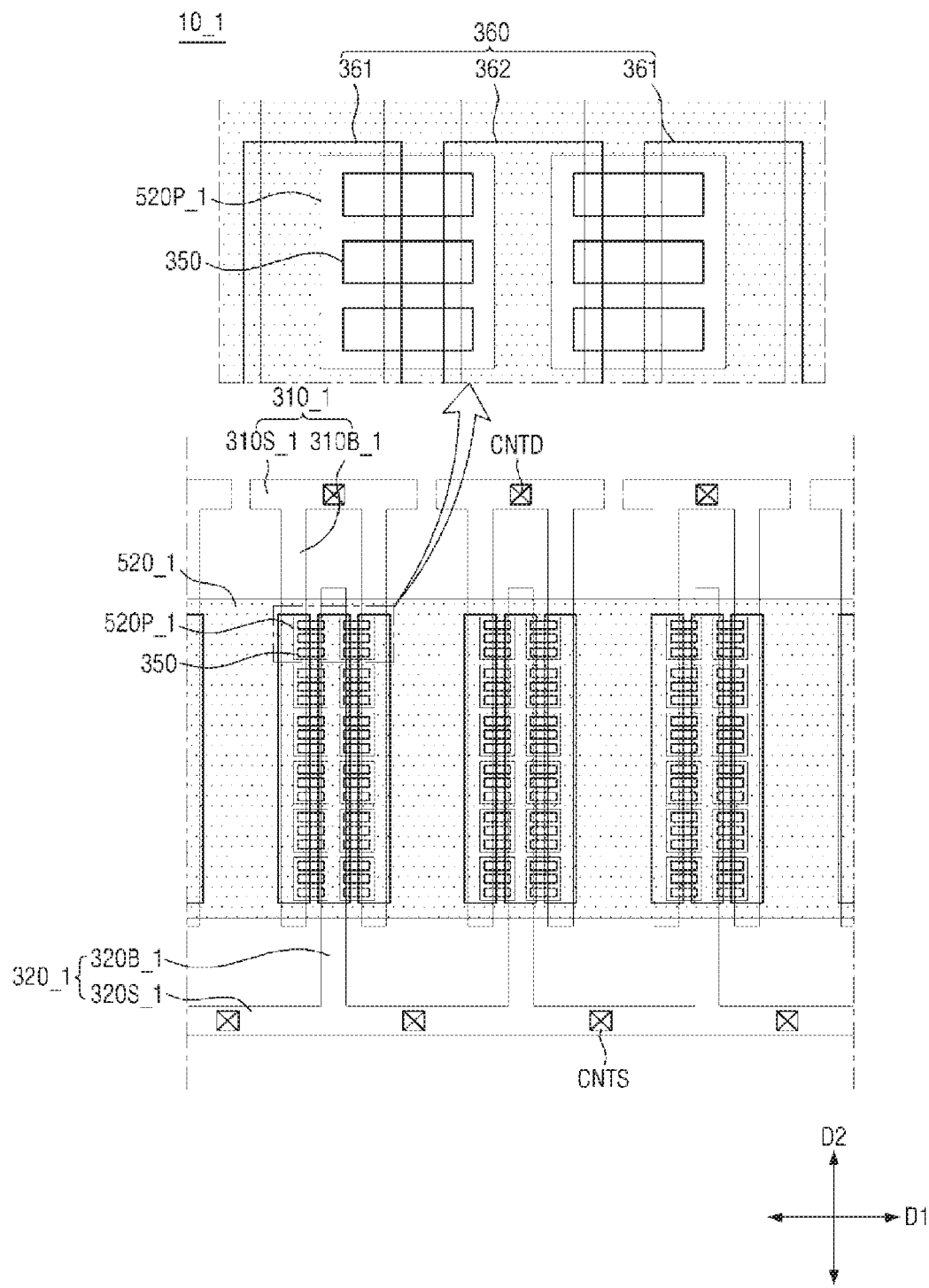

[Fig. 14]
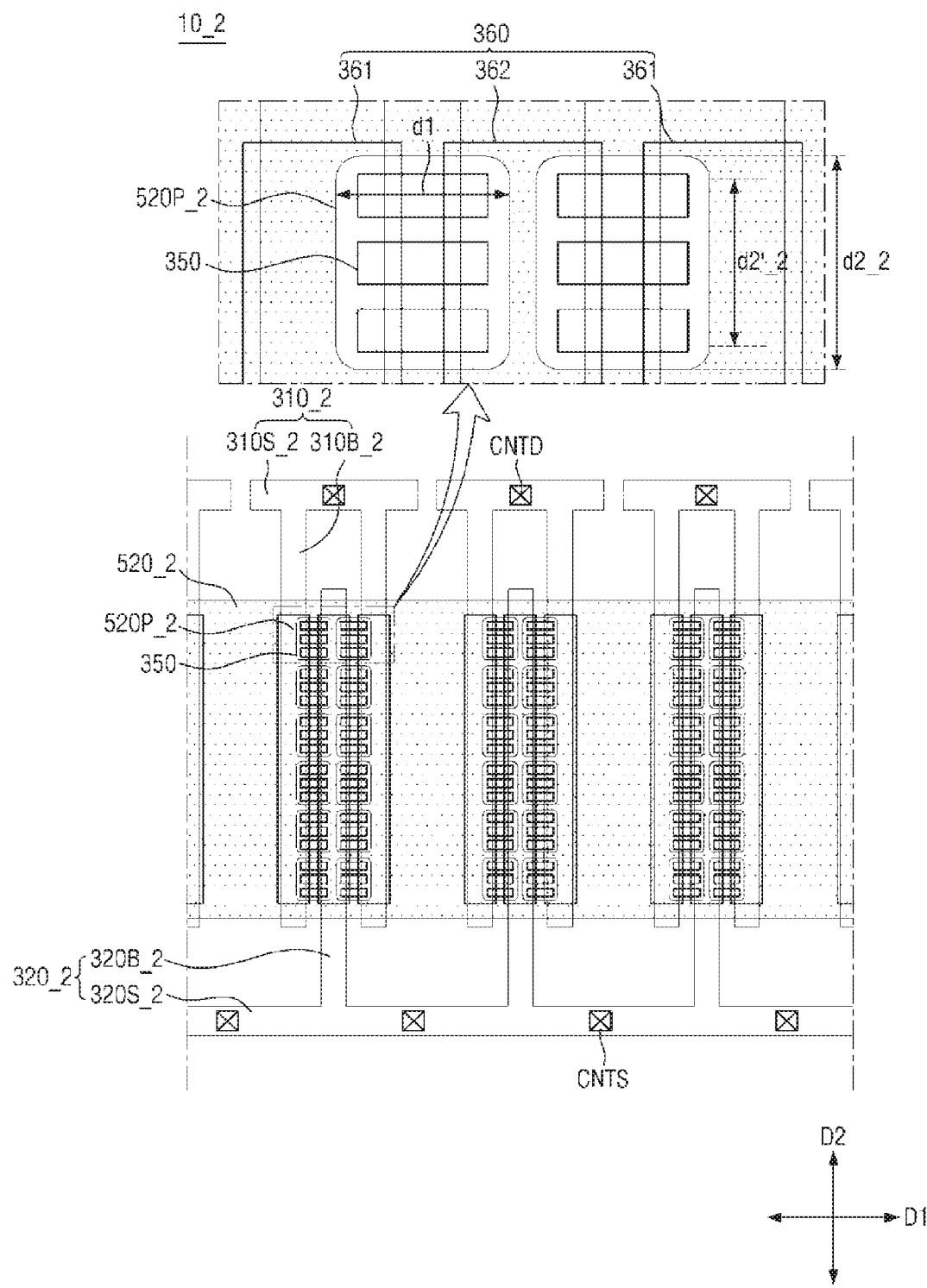

[Fig. 15]
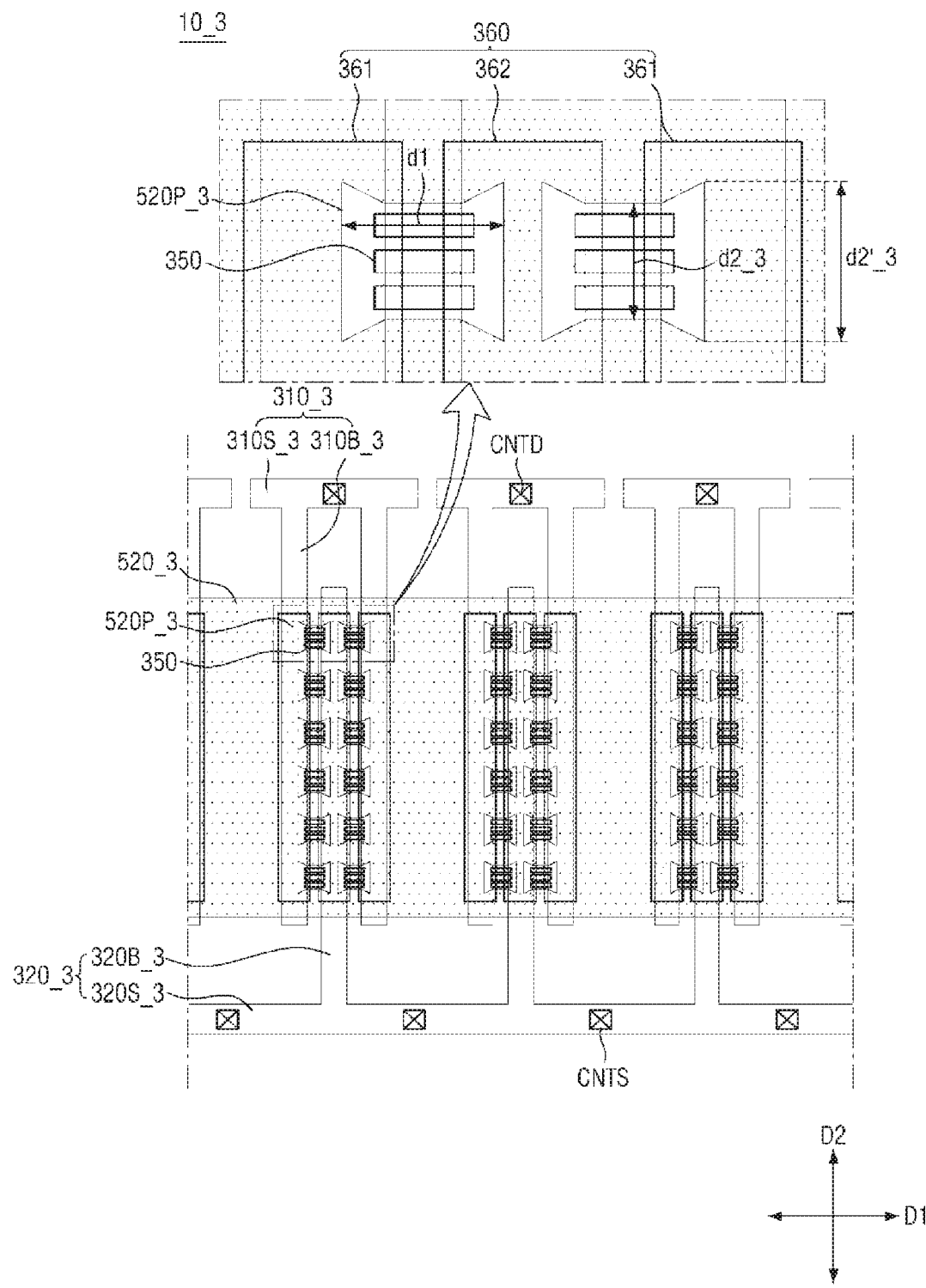

[Fig. 16]
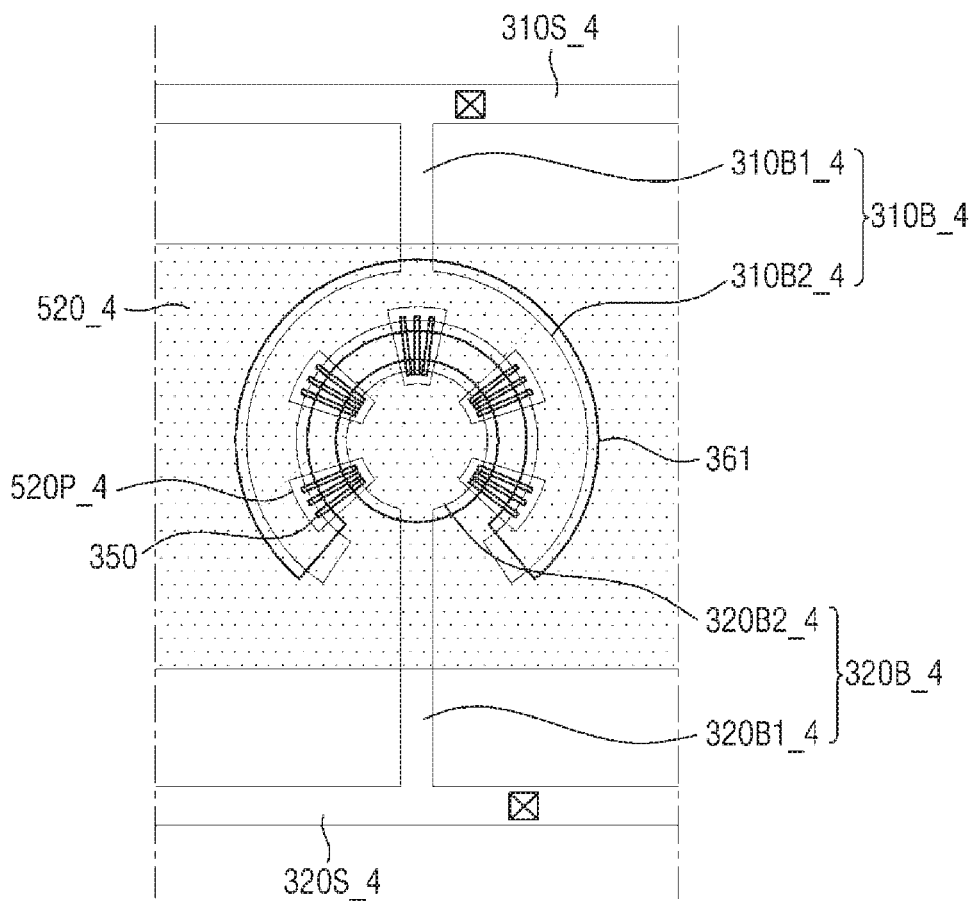

[Fig. 17]
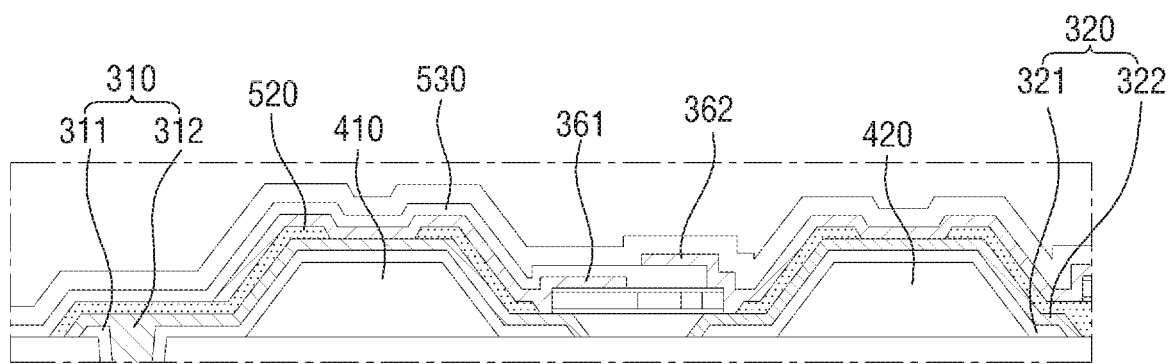

DISPLAY DEVICE

CROSS-REFERENCE TO RELATED APPLICATIONS

This application is a National Phase Patent Application and claims priority to and the benefit of International Application Number PCT/KR2018/011285, filed on Sep. 21, 2018, which claims priority to Korean Patent Application Number 10-2018-0077640, filed on Jul. 4, 2018, the entire contents of all of which are incorporated herein by reference.

TECHNICAL FIELD

The present invention relates to a display device, and, more particularly, to a display device including an inorganic light emitting diode array.

BACKGROUND ART

The importance of a display device has increased with the development of multimedia. Accordingly, various types of display devices such as an organic light emitting display (OLED) and a liquid crystal display (LCD) have been used.

A display device is a device for displaying an image, and includes a display panel such as a light emitting display panel or a liquid crystal panel. Among them, the light emitting display panel may include light emitting elements such as light emitting diodes (LEDS). Light emitting diodes (LEDs) may include an organic light emitting diode (OLED) using an organic material as a fluorescent material and an inorganic light emitting diode using an inorganic material as a fluorescent material.

In the case of an organic light emitting diode (OLED), there is an advantage that its manufacturing process is simple and it has flexible characteristics because it uses an organic material as a fluorescent material. However, it is known that the organic material is vulnerable to high-temperature driving environments and has a relatively low efficiency of blue light.

On the other hand, in the case of an inorganic light emitting diode, there is an advantage that it has durability even in high-temperature environments and has higher efficiency of blue light than an organic light emitting diode because it uses an inorganic semiconductor as a fluorescent material. Further, even in the manufacturing process that has been pointed out as a limitation of a conventional inorganic light emitting diode, transcription methods using dielectrophoresis (DEP) have been developed. Therefore, research on inorganic light emitting diodes having higher durability and efficiency than organic light emitting diodes is being continued.

DISCLOSURE

Technical Problem

A subject to be achieved by the present invention is to provide a display device in which light emitting elements are uniformly aligned by arranging the light emitting elements only in an arbitrary area and luminance of each pixel is uniform.

Additional advantages, subjects, and features of the invention will be set forth in part in the description which follows and in part will become apparent to those having ordinary skill in the art upon examination of the following or may be learned from practice of the invention.

Technical Solution

According to an aspect of the present disclosure, a display device comprises a first electrode, a second electrode disposed to be spaced apart from the first electrode and face the first electrode, a first insulating layer disposed to cover the first electrode and the second electrode, a second insulating layer disposed on at least a part of the first insulating layer and exposing at a part of a region where the first electrode and the second electrode overlaps the first insulating layer and at least one light emitting element disposed on the exposed first insulating layer between the first electrode and the second electrode, wherein the second insulating layer includes at least one opening exposing the first insulating layer and disposed to be spaced apart from each other on a region where the first electrode and the second electrode face each other, and a bridge portion between the openings, and the light emitting element is disposed on the opening.

The at least one opening may be disposed in a first direction in which the first electrode extends, and is spaced apart from another neighboring opening.

The first insulating layer and the second insulating layer may include materials having different etching selection ratios.

The second insulating layer may be divided into one side region and the other side region in a second direction intersecting the first direction with respect to a center of the opening, and the bridge portion may connect the one side region and the other side region.

The bridge portion may extend in the second direction.

The opening may include a first opening and a second opening spaced apart from the first opening in the first direction, and the light emitting element may include a first light emitting element and a second light emitting element disposed in the first opening, and a third light emitting element disposed in the second opening.

The first light emitting element and the second light emitting element may be disposed to be spaced apart from each other in the first opening.

A distance between the first light emitting element and the second light emitting element may be shorter than a distance between the first light emitting element and the third light emitting element.

A density of the light emitting elements disposed in the first opening and the second opening may be higher than a density of the light emitting element disposed in the bridge portion between the first opening and the second opening.

The opening may be disposed to overlap each side portion in a direction in which the first electrode and the second electrode face each other.

The center of the opening may be disposed closer to the first electrode than the second electrode, and a first overlap portion where the first electrode overlaps the opening may be larger than a second overlap portion where the second electrode overlaps the opening.

A width of the opening, measured in a second direction intersecting the first direction in which the first electrode extends, may be shorter than a distance between the centers of the first electrode and the second electrode, and may be longer than a distance between side portions of the first electrode and the second electrode, the side portions facing each other.

The width measured at the center of the opening in the first direction may be shorter than a width measured at both ends of the opening in the first direction.

A width of the opening, measured in the second direction, may be longer than a length of a long axis of the light emitting element.

The first electrode may include a first electrode connection portion and a first electrode counter portion connected to the first electrode connection portion and having a circular shape, and the second electrode may include a second electrode counter portion spaced apart from the first electrode counter portion to surround an outer surface thereof and terminated in a state of being spaced apart from the first electrode connection portion, and a second electrode connection portion connected to the second electrode counter portion.

The light emitting element may be disposed between the first electrode counter portion and the second electrode counter portion, one end of the light emitting element may be disposed on the second electrode counter portion, and the other end of the light emitting element is disposed on the first electrode counter portion.

According to another aspect of the present disclosure, a display device comprises a first electrode stem portion and a second electrode stem portion extending in a third direction and spaced apart from each other, at least one first electrode branch portion branched from the first electrode stem portion and extending in a fourth direction intersecting the third direction, a second electrode branch portion branched from the second electrode stem portion and extending in the fourth direction, a first insulating layer covering the first electrode branch portion and the second electrode branch portion, a second insulating layer disposed on at least a part of the first insulating layer and exposing at least a part of a region where the first electrode branch portion and the second electrode branch portion overlaps the first insulating layer, at least one light emitting element disposed on the exposed first insulating layer between the first electrode branch portion and the second electrode branch portion and a first contact electrode contacting the first electrode branch portion and one end of the light emitting element and a second contact electrode contacting the second electrode branch portion and the other end of the light emitting element, wherein the second insulating layer includes at least one opening exposing the first insulating layer and disposed to be spaced apart from each other on a region where the first electrode branch portion and the second electrode branch portion face each other, and a bridge portion between the openings, and the light emitting element is disposed on the opening.

The first insulating layer and the second insulating layer may include materials having different etching selection ratios.

The first insulating layer and the second insulating layer may be patterned in a region spaced apart from both ends of the opening to expose the first electrode branch portion and the second electrode branch portion, and the first contact electrode and the second contact electrode may be in contact with the exposed first electrode branch portion and second electrode branch portion, respectively.

One end of the light emitting element may be electrically connected to the first electrode branch portion, the other end of the light emitting element may be electrically connected to the second electrode branch portion, one end of the light emitting element may include an n-type conductive semiconductor, and the other end of the light emitting element may include a p-type conductive semiconductor.

The details of other embodiments are included in the detailed description and the drawings.

Advantageous Effects

In the display device according to an embodiment, opening patterns exposing a part of an insulating layer on a first electrode and a second electrode are provided, and thus the alignment of light emitting elements can be lead into the opening patterns. Accordingly, the opening patterns are spaced apart from each other at regular intervals in a region where the first electrode and the second electrode face each other, thereby uniformly aligning the light emitting elements. Therefore, the display device can have uniform luminance for each pixel.

Advantageous effects according to the present disclosure are not limited to those mentioned above, and various other advantageous effects are included herein.

DESCRIPTION OF DRAWINGS

FIG. 6 is a plan view of a display device according to another embodiment;

FIG. 7 is a schematic perspective view of a light emitting element according to an embodiment;

FIGS. 8 to 12 are plan views schematically illustrating a method of manufacturing a display device according to an embodiment;

FIGS. 13 to 15 are plan views schematically illustrating display devices according to other embodiments;

FIG. 16 is a plan view of a display device according to still another embodiment; and FIG. 17 is a cross-sectional view of a display device according to still another embodiment.

MODES OF THE INVENTION

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

Hereinafter, embodiments of the present invention will be described in detail with reference to the accompanying drawings.

Figure 1:
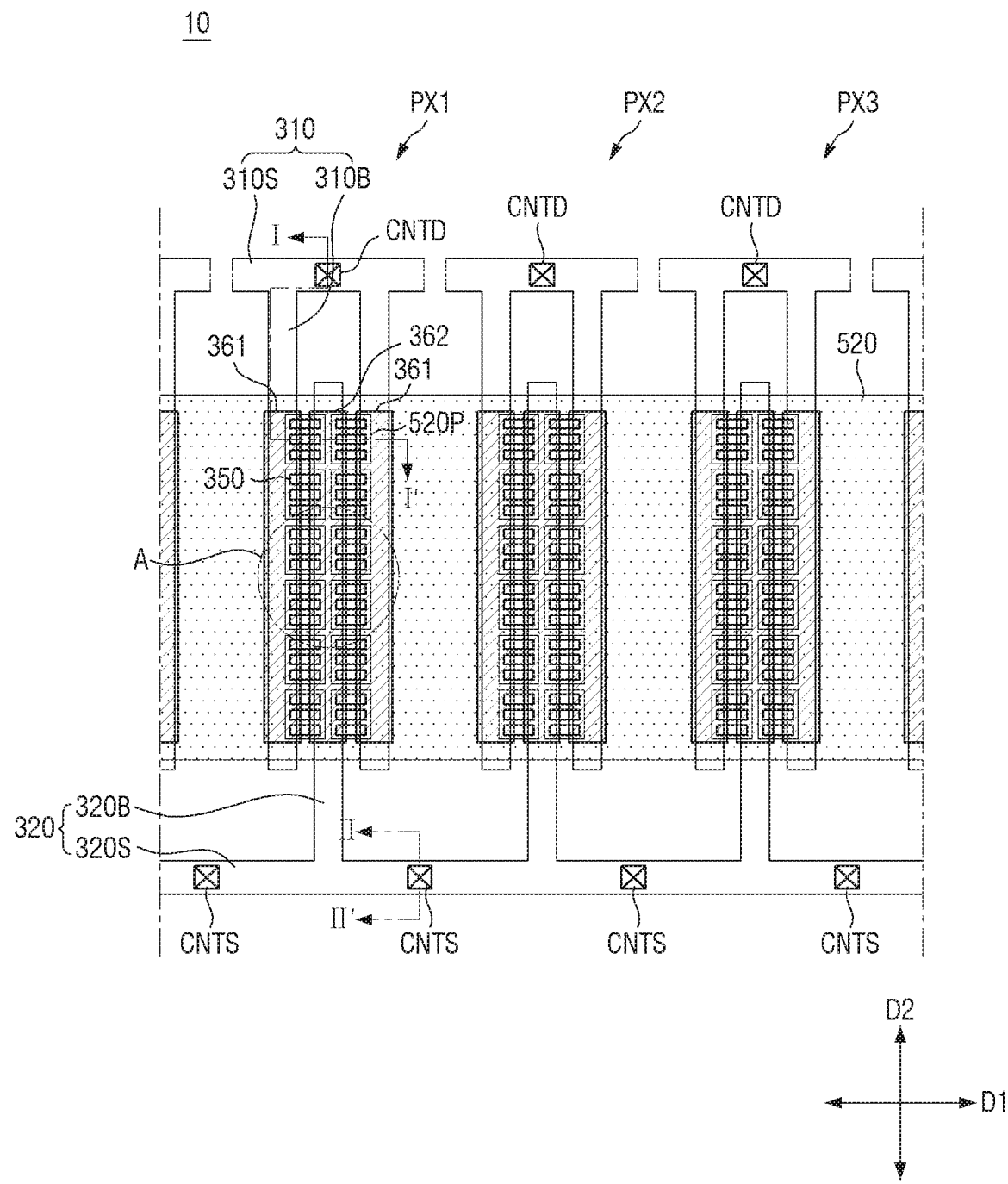
FIG. 1 is a plan view of a display device according to an embodiment.

FIG. 1 is a cross-sectional view of a display device according to an embodiment.

A display device 10 may include at least one region defined as a pixel PX. A plurality of pixels PX may be arranged in a display unit of the display device 10 to emit light of a specific wavelength band to the outside of the display device 10. Although FIG. 1 illustrates three pixels PX1, PX2, and PX3, it is obvious that the display device 10 includes a larger number of pixels. Although the drawings show a plurality of pixels PX arranged only in one direction, for example, in a first direction D1, the plurality of pixels PX may be arranged in a second direction D2 intersecting the first direction D1. Further, the pixels PX shown in FIG. 1 may be divided into a plurality of pixels to allow each of the plurality of pixels to constitute one pixel PX. The pixels may be arranged in a vertical direction (or second direction D2) or may be arranged in a zigzag form, instead of being arranged only in the first direction D1 in parallel as shown in FIG. 1.

Although not shown in the drawings, the display device 10 may include a light emitting area where light emitting elements are arranged to emit light of a specific color, and a non-light emitting area defined as an area other than the light emitting area. The non-light emitting area may be covered by specific members not to be viewed from the outside. The non-light emitting area may be provided with various members for driving the light emitting elements arranged in the light emitting area. For example, the non-light emitting area may be provided with a wiring for applying an electrical signal to the light emitting area, a circuit unit, a driving unit, and the like. However, the present invention is not limited thereto.

Each of the plurality of pixels may include at least one light emitting element 350 emitting light of a specific wavelength band to display a color. The light emitted from the light emitting element 350 may be transmitted to the outside through the light emitting portion of the display device 10. In an embodiment, light emitting elements 350 emitting light of different colors from each other may be provided for each of the pixels PX expressing different colors from each other. For example, the first pixel PX1 expressing a red color may include a light emitting element 350 emitting red light, the second pixel PX2 expressing a green color may include a light emitting element 350 emitting green light, and the third pixel PX3 expressing a blue color may include a light emitting element 350 emitting blue light. However, the present invention is not limited thereto, and in some cases, pixels PX expressing different colors from each other may include light emitting elements 350 emitting light of the same color (for example, blue), and the colors of the respective pixels PX may be expressed by providing a wavelength conversion layer or a color filter on a light emitting path. However, the present invention is not limited thereto, and in some cases, adjacent pixels PX may emit light of the same color.

Referring to FIG. 1, the display device 10 may include a plurality of electrodes 310 and 320, an opening 520P of a second insulating layer 520 disposed on the plurality of electrodes 310 and 320, and a plurality of light emitting elements 350. At least a part of the each of the electrodes 310 and 320 may be disposed in each pixel PX, electrically connected to the light emitting elements 350, and apply electrical signals so as to emit light of a specific color.

Further, at least a part of the each of the electrodes 310 and 320 may be used to form an electric field in the pixel PX in order to align the light emitting elements 350. Specifically, when aligning the light emitting elements 350 emitting light of different colors from each other in the plurality of pixels PX, it is required to accurately align the light emitting elements 350 for each pixel PX. When aligning the light emitting elements 350 using dielectrophoresis, a solution containing the light emitting elements is applied onto the display device 10, an AC power is applied to the solution to form a capacitance due to an electric field, and thus the light emitting elements 350 may be aligned by a dielectrophoretic force.

Here, the second insulating layer 520 is disposed to cover each of the electrodes 310 and 320 and expose a part of each of the electrodes 310 and 320 through the opening 520P, and thus the light emitting elements 350 may be uniformly aligned on each of the electrodes 310 and 320. The opening 520P may control the intensity of the electric field formed on each of the electrodes 310 and 320, thereby forming a stronger dielectrophoretic force in a specific region. Accordingly, the light emitting elements 350 may be preferentially aligned in a specific region to which a stronger dielectrophoretic force is applied. Therefore, the alignment of the light emitting elements 350 on each of the electrodes 310 and 320 may be controlled depending on the shape of the opening 520P. Details thereof will be described later.

The plurality of electrodes 310 and 320 may include a first electrode 310 and a second electrode 320. In an exemplary embodiment, the first electrode 310 may be a pixel electrode separated for each pixel PX, and the second electrode 320 may be a common electrode connected in common along the plurality of pixels PX. The first electrode 310 may be an anode electrode of the light emitting element 350, and the second electrode 320 may be a cathode electrode of the light emitting element 350. However, the present invention is not limited to this case, and may have an opposite case. In other words, any one of the first electrode 310 and the second electrode 320 may be an anode electrode, and the other thereof may be a cathode electrode.

The first electrode 310 and the second electrode 320 may include electrode stem portion 310S and 320S extending in a first direction D1 and electrode branch portions 310B and 320B extending in a second direction D2 intersecting the first direction D1 and branched from the electrode stem portions 310S and 320S, respectively.

Specifically, the first electrode 310 may include a first electrode stem portion 310S extending in the first direction D1 and at least one first electrode branch portion 310B branched from the first electrode stem portion 310S and extending in the second direction D2. Although not shown in the drawings, one end of the first electrode stem portion 310S may be connected to a signal application pad, and the other end thereof may extend in the first direction D1 but electrically separated between the pixels PX. The signal application pad may be connected to the display device or an external power source to apply an electrical signal to the first electrode stem portion 310S or apply an AC power thereto at the time of aligning the light emitting elements 350.

The first electrode stem portion 310S of any one pixel is placed on substantially the same line as the first electrode stem portion 310S of a neighboring pixel belonging to the same row (for example, adjacent in the first direction D1). In other words, the first electrode stem portion 310S of one pixel is terminated with both ends thereof being spaced apart from each other between the pixels PX, whereas the first electrode stem portion 310S of the neighboring pixel may be aligned with the extension line of the first electrode stem portion 310S of the one pixel. Such an arrangement of the first electrode stem portions 310S may be performed by forming one stem electrode during a manufacturing process, performing a process of aligning the light emitting elements 350, and then disconnecting the stem electrode using a laser. Accordingly, the first electrode stem portion 310S disposed in each pixel PX may apply different electrical signals from each other to the respective pixels PX, and the respective pixels PX may be driven separately from each other.

The first electrode branch portion 310B may be branched from at least a part of the first electrode stem portion 310S and extended in the second direction D2, but may be terminated while being spaced apart from the second electrode stem portion 320S disposed to face the first electrode stem portion 310S. That is, one end of the first electrode branch portion 310B may be connected to the first electrode stem portion 310S, and the other end thereof may be disposed in the pixel PX while being spaced apart from the second electrode stem portion 320S. Since the first electrode branch portion 310B is connected to the first electrode stem portion 310S electrically separated for each pixel PX, the first electrode branch portion 310B may receive different electrical signals from each other for each pixel PX.

One or more first electrode branch portions 310B may be disposed for each pixel PX. Although it is shown in FIG. 1 that two first electrode branch portions 310B are disposed for each pixel PX, the present invention is not limited thereto, and a plurality of first electrode branch portions 310B may be disposed for each pixel PX. In this case, the first electrode branch portions 310B may be spaced apart from each other, and each of the first electrode branch portions 310B may be spaced apart from the second electrode branch portion 320B to be described later. In some embodiments, the second electrode branch portion 320B is disposed between the first electrode branch portions 310B, so that each pixel PX may have a symmetrical structure with respect to the second electrode branch portion 320B.

The second electrode 320 may include a second electrode stem portion 320S extending in the first direction D1, spaced apart from the first electrode stem portion 310S and facing the first electrode stem portion 310S, and at least one second electrode branch portion 320B branched from the second electrode stem portion 320S, extending in the second direction D2, spaced apart from the first electrode branch portion 310B and facing the first electrode branch portion 310B. Like the first electrode stem portion 310S, one end of the second electrode stem portion 320S may also be connected to a signal application pad. However, the other end of the second electrode stem portion 320S may extend to the plurality of pixels PX adjacent in the first direction D1. That is, the second electrode stem portion 320S may be electrically connected between the pixels PX. Accordingly, both ends of the second electrode stem portion 320S of any one pixel may be connected to one end of the second electrode stem portion 320S of a neighboring pixel PX between the respective pixels PX, so that the same electrical signal may be applied to the respective pixels PX.

The second electrode branch portion 320B may be branched from at least a part of the second electrode stem portion 320S and extended in the second direction D2, but may be terminated while being spaced apart from the first electrode stem portion 310S. That is, one end of the second electrode branch portion 320B may be connected to the second electrode stem portion 320S, and the other end thereof may be disposed in the pixel PX while being spaced apart from the first electrode stem portion 310S. Since the second electrode branch portion 320B is connected to the second electrode stem portion 320S electrically connected for each pixel P, the second electrode branch portion 320B may receive the same electrical signal for each pixel PX.

Further, the second electrode branch portion 320B may be disposed to be spaced apart from the first electrode branch portion 310B and face the first electrode branch portion 310B. Here, since the first electrode stem portion 310S and the second electrode stem portion 320S are spaced apart from each other and face each other in directions opposite to each other with respect to the center of each pixel PX, the first electrode branch portion 310B and the second electrode branch portion 320B may extend in directions opposite to each other. In other words, the first electrode branch portion 310B extends in one direction of the second direction D2, and the second electrode branch portion 320B extends in the other direction of the second direction D2, so that one ends of the respective branch portions may be disposed in directions opposite to each other with respect to the center of the pixel PX. However, the present invention is not limited thereto, and the first electrode stem portion 310S and the second electrode stem portion 320S may be disposed to be spaced apart from each other in the same direction with respect to the center of the pixel PX. In this case, the first electrode branch portion 310B and the second electrode branch portion 320B, respectively branched from the first electrode stem portion 310S and the second electrode stem portion 320S, may extend in the same direction.

A plurality of light emitting elements 350 may be arranged between the first electrode branch portion 310B and the second electrode branch portion 320B. Specifically, one end of at least some of the plurality of light emitting elements 350 may be electrically connected to the first electrode branch portion 310B, and the other end thereof may be electrically connected to the second electrode branch portion 320B. Contact electrodes 361 and 362 may be disposed on the first electrode branch portion 310B and second electrode branch portion 320B connected to the light emitting elements 350, respectively. The contact electrodes 361 and 362 may be in contact with the light emitting elements such that the light emitting elements are electrically connected to the electrode branch portions 310B and 320B. The contact electrodes 361 and 362 may be in contact with the both side ends of light emitting elements 350. Accordingly, the light emitting elements 350 may receive electrical signals to emit light of specific colors.

In some embodiments, one end of the light emitting element 350 contacting the first electrode branch portion 310B may be a conductive material layer doped with an n-type dopant, and the other end of the light emitting element 350 contacting the second electrode branch portion 320B may be a conductive material layer doped with a p-type dopant. However, the present invention is not limited thereto.

The plurality of light emitting elements 350 may be arranged between the first electrode 310 and the second electrode 320. The second insulating layer 520 may be disposed on the first electrode 310 and the second electrode 320 to cover the first electrode 310 and the second electrode 320, and may be provided with the opening 520P to partially expose the first electrode 310 and the second electrode 320. The plurality of light emitting elements 350 may be arranged in the opening 520P.

Specifically, a first insulating layer 510 (shown in FIG. 4) may be disposed on the first electrode 310 and the second electrode 320 to cover the first electrode 310 and the second electrode 320, and the second insulating layer 520, which is patterned to expose at least a part of a region where the first electrode 310 and the second electrode 320 overlap the first insulating layer 510, may be disposed on the first insulating layer 510. The second insulating layer 520 may include the opening 520P to expose at least a part of the first insulating layer 510.

The first insulating layer 510 may be disposed to cover the first electrode 310 and the second electrode 320 to protect the first electrode 310 and the second electrode 320. The first insulating layer 510 may be disposed to prevent the first electrode 310 and the second electrode 320 from being shorted during the manufacturing process of the display device 10. The first insulating layer 510 may be disposed even in a region where the first electrode 310 and the second electrode 320 are spaced apart from each other and face each other, so as to electrically isolate the first electrode 310 and the second electrode 320. Although not shown in the drawings, the first insulating layer 510 may be patterned over at least a part of the first electrode 310 and the second electrode 320, and thus the contact electrode 361 and 362, which will be described later, may be in contact with the first electrode 310 or the second electrode 320.

The second insulating layer 520 may be disposed on the first insulating layer 510, but may be patterned to expose at least a part of a region where the first insulating layer 510 overlaps the first electrode 310 and the second electrode 320. For example, the second insulating layer 520 may be patterned to expose at least a part of a region where the first insulating layer 510 overlaps a side portion at which the first electrode 310 and the second electrode 320 face each other. That is, the second insulating layer 520 may include the opening 520P, and the opening 520P may expose at least a part of the first insulating layer 510 at the side portion at which the first electrode 310 and the second electrode 320 face each other. The light emitting elements 350 may be arranged on the exposed first insulating layer 510 between the first electrode 310 and the second electrode 320. Although it is shown in FIG. 1 that the opening 520P has a rectangular shape, the present invention is not limited thereto, and the opening 520P may have various shapes and structures. A more detailed arrangement and lamination structure of the first insulating layer 510 and the second insulating layer 520 will be described later with reference to the cross-sectional view of the display device 10 shown in FIG. 4. Hereinafter, the shapes and arrangement of the openings 520P will be described in detail.

Figure 2:
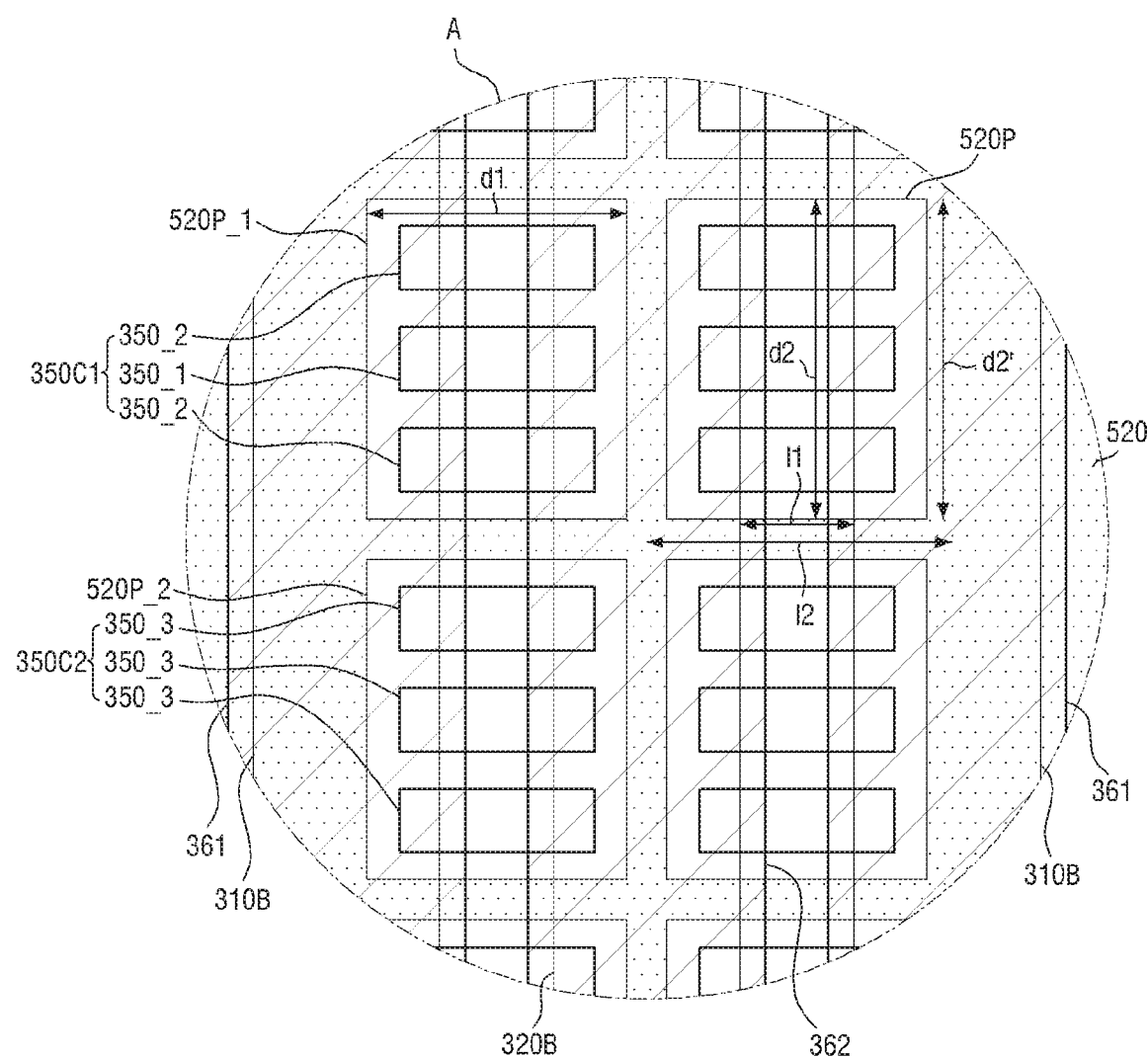
FIG. 2 is an enlarged view of the portion A of FIG. 1.

FIG. 2 is an enlarged view of the portion A of FIG. 1.

Referring to FIGS. 1 and 2, the second insulating layer 520 may include a plurality of openings 520P, and the plurality of openings 520P may be arranged to be spaced apart from each other. Since the plurality of openings 520P are spaced apart from each other, the region where the second insulating layer 520 is present may function as a bridge connecting one side region and the other side region in the first direction D1 about the opening 520P. However, the present invention is not limited thereto, and each of the openings 520P may be a region formed by patterning a part of the second insulating layer 520, and thus a non-patterned region may exist between the openings 520P.

The plurality of openings 520P may be arranged in the second direction D2. Any one opening 520P may be spaced apart from another neighboring opening 520P, and the second insulating layer 520 may be disposed between the openings 520P different from each other. The second insulating layer 520 disposed between the openings 520P in one pixel PX may extend in the first direction D1, and may be placed on a substantially straight line with another second insulating layer 520 disposed between the openings 520P in the neighboring pixel PX. In other words, the openings 520P may expose a part of the second insulating layer 520, so that the second insulating layer 520 may be disposed in a substantially lattice shape.

The opening 520P may be disposed in a region where the first electrode 310 and the second electrode 320 face each other, and may be disposed to overlap a side portion where the first electrode 310 and the second electrode 320 face each other. One opening 520P may be disposed to protrude toward the center of the first electrode 310 and the second electrode 320 from the side portion of the first electrode 310 and the second electrode 320.

Specifically, the width d1 measured in the one axis direction of the opening 520P, that is, in the first direction, may be shorter than the distance I2 between the centers of the first electrode 310 and the second electrode 320, and may be longer than the distance I1 between the opposing sides of the first electrode 310 and the second electrode 320. That is, the opening 520P may be disposed to expose the sides of the first electrode 310 and the second electrode 320 and cover the centers of the first electrode 310 and the second electrode 320 on the first insulating layer 510. Further, the center of the opening 520P may be aligned with the center of a region between the sides of the first electrode 310 and the second electrode 320. In other words, the opening 520P may have a symmetric structure between the first electrode 310 and the second electrode 320. However, the present invention is not limited thereto. In some embodiments, the center of the opening 520P may be disposed adjacent to any one electrode, so as to form an asymmetric structure on the first electrode 310 and the second electrode 320.

The length h (shown in FIG. 7) of the long axis of the light emitting element 350 may be longer than the distance I1 between the sides of the first electrode 310 and the second electrode 320, but may be shorter than the distance I2 between the centers of the first electrode 310 and the second electrode 320. In an exemplary embodiment, the distance I2 between the centers of the first electrode 310 and the second electrode 320 may be 1.25 times to 1.75 times the length h of the long axis of the light emitting element 350. For example, when the length h of the long axis of the light emitting element 350 is 4 μm to 7 μm, the distance I2 between the centers of the first electrode 310 and the second electrode 320 may be 5 μm to 12 μm. The present invention is not limited thereto. Accordingly, in the opening 520P, both ends of the light emitting element 350 are disposed on the first electrode 310 and the second electrode 320, respectively, and may be in contact with the contact electrodes 361 and 362 to be described later.

Meanwhile, the widths measured in the other axis direction of the opening 520P intersecting the one axis direction thereof, for example, the widths d2 and d2' measured in the second direction D2 may be constant toward the center of each of the electrodes 310 and 320. Referring to FIG. 2, the width d2 measured at the center of the opening 520P in the second direction D2 may be equal to the width d2' measured at the end of the opening 520P in the second direction D2. That is, the shape of the opening 520P may be a substantially angled rectangle. However, the shape of the opening 520P is not limited thereto and may have various structures. In some embodiments, the width d2 measured in the second direction D2 of the opening 520P becomes shorter toward the end of the opening 520P, and both ends of the opening 520P may be rounded. In another embodiment, the width d2 measured at the center of the opening 520P may become longer toward the center of each of the electrodes 310 and 320. Other embodiments are referred to for a more detailed description.

The width d2 measured in the second direction D2 of the opening 520P may be shorter than the width measured in the second direction D2 of the first electrode 310 and the second electrode 320. Accordingly, a plurality of openings 520P may be disposed on one of the first electrode 310 and the second electrode 320.

As described above, the plurality of light emitting elements 350 are disposed in the opening 520P between the first electrode 310 and the second electrode 320. One end of the light emitting element 350 may be in contact with the first electrode 310 or the first electrode branch portion 310B, and the other end thereof may be in contact with the second electrode 320 or the second electrode branch portion 320B. For example, the light emitting elements 350 may be aligned in the second direction D2, and may be arranged in parallel to each other.

The light emitting elements 350 may include any first light emitting element 350_1, any other second light emitting elements 350_2 disposed relatively adjacent to the first light emitting element 350_1 in a first opening 520P_1, and any other third light emitting elements 350_3 disposed in a second opening 520P_2 adjacent to the first opening 520P_1. The first light emitting element 350_1 and the second light emitting elements 350_2 may be aligned between the first electrode 310 and the second electrode 320 while being spaced apart from each other in the first opening 520P_1. The distance between the first light emitting element 350_1 and each of the second light emitting elements 350_2 may be constant, but may vary without limitation.

The third light emitting elements 350_3 may be arranged in the second opening 520P_2 spaced apart from the first opening 520P_1 where the first light emitting element 350_1 and the second light emitting elements 350_2 are arranged, and may be aligned to be spaced apart from each other. The first opening 520P_1 and the second opening 520P_2 may be spaced apart from each other by a predetermined distance. That is, the first light emitting element 350_1 may be spaced apart from the second light emitting elements 520_2 at various intervals, but may be relatively uniformly spaced from the third light emitting elements 350_3.

The light emitting elements 350 may be arranged at a high density in the opening 520P, and may be arranged at a low density in a region where the plurality of openings 520P are spaced apart from each other to allow the second insulating layer 520 to exist, for example, in a bridge region where one side and the other side of the opening 520P are connected in the first direction D1.

When an AC power is applied between the first electrode 310 and the second electrode 320 to form a capacitance by an electric field, a dielectrophoretic force FDEP may be transmitted to the light emitting element 350. The intensity of the dielectrophoretic force applied to the light emitting element 350 may be varied by the spatial variation of an electric field. For example, if there are two adjacent regions having different electric field intensities, the dielectrophoretic forces may be applied more strongly toward the region where the intensity of the electric field is stronger.

Since the opening 520P of the second insulating layer 520 is disposed to expose a part of the first insulating layer 510, the intensity of the electric field formed by the AC power source may be different on the first insulating layer 510 and the second insulating layer 520. Assuming that the intensity of the electric field formed in the first insulating layer 510 increases depending on the selection of the materials of the first insulating layer 510 and the second insulating layer 520, the intensity of the electric field formed on the first insulating layer 510 and the second insulating layer 520 may vary spatially in the opening 520P of the second insulating layer 520. Thus, the dielectrophoretic force applied to the light emitting element 350 may be stronger in the opening 520P. Accordingly, the preferential alignment of the light emitting elements 350 may be induced between the first electrode 310 and the second electrode 320 in the opening 520P.

The opening 520P may allow the light emitting elements 350 to be uniformly arranged in each pixel PX. When the light emitting elements 350 are directly aligned on the first insulating layer 510 by dielectrophoresis, they may be arranged between the first electrode 310 and the second electrode 320 at arbitrary alignment degrees. In contrast, when the light emitting elements 350 are aligned after the second insulating layer 520 including the opening 520P is formed, the light emitting elements 350 are preferentially aligned in the opening 520P, and thus the light emitting elements 350 may be uniformly aligned. Therefore, the display device 10 may have a uniform luminance for each pixel PX, and may prevent a phenomenon that light is separated from one pixel PX and emitted to the outside according to the alignment of the light emitting elements 350.

Meanwhile, as shown in FIG. 1, the first electrode stem portion 310S and the second electrode stem portion 320S may be electrically connected to a thin film transistor or a power supply wiring 161, which will be described later, through contact holes such as a first electrode contact hole CNTD and a second electrode contact hole CNTS, respectively. Although it is shown in FIG. 1 that the contact holes on the first electrode stem portion 310S and the second electrode stem portion 320S are arranged for each pixel PX, the present invention is not limited thereto. As described above, since the second electrode stem portion 320S may be extended to the adjacent pixel PX and electrically connected, in some embodiment, the second electrode stem portion 320S may be electrically connected to the thin film transistor through one contact hole.

Figure 3:
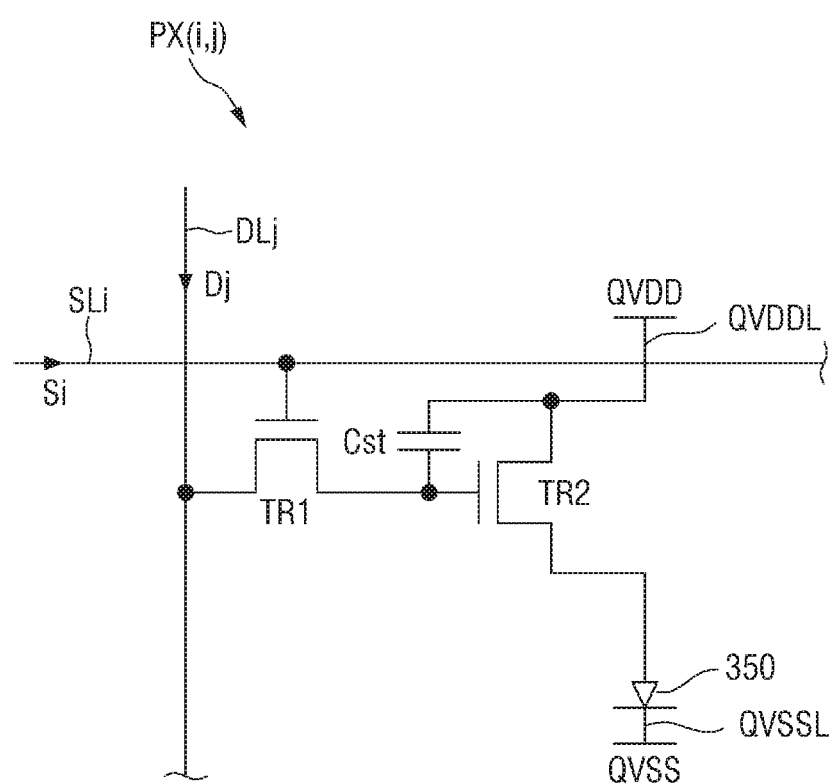
FIG. 3 is an equivalent circuit diagram of one pixel of the display device of FIG. 1.

FIG. 3 is an equivalent circuit diagram of one pixel of the display device of FIG. 1. Although not shown in the drawings, the display device 10 may include a plurality of pixels PX. In FIG. 2, any i and jth pixel PX(i,j) will be exemplified and described.

Referring to FIG. 3, any i and jth pixel PX(i,j) of the display device 10 may include an ith scan line SLi, a jth data line DLj, a first switching element TR1, a second switching element TR2, a light emitting element 350, and a storage capacitor Cst.

The first switching element TR1 may be electrically connected to the ith scan line SLi, the jth data line DLj, and the second switching element TR2. In an exemplary embodiment, the first switching element TR1 and the second switching element TR2 may be three terminal elements such as thin film transistors. Hereinafter, the first switching element TR1 and the second switching element TR2 will be described assuming that they are thin film transistors.

The first switching element TR1 may include a control electrode electrically connected to the ith scan line SLi, a first electrode electrically connected to the jth data line DLj, and a second electrode electrically connected to a control electrode of the second switching element TR2.

The second switching element TR2 may include a control electrode electrically connected to the second electrode of the second switching element TR2, a first electrode electrically connected to a first driving voltage line QVDDL to which a first driving voltage QVDD is provided, and a second electrode electrically connected to the light emitting element 350.

The storage capacitor Cst may include a first electrode electrically connected to the second electrode of the first switching element TR1 and a second electrode electrically connected to the first driving voltage line QVDDL to which the first driving voltage QVDD is provided.

The first switching element TR1 may be turned on according to a scan signal Si received from the ith scan line SLi, and may supply a data signal Dj received from the jth data line DLj to the storage capacitor Cst. The storage capacitor Cst may charge a voltage difference between a voltage of the received data signal Dj and a voltage of the first driving voltage QVDD. The second switching device TR2 may control the amount of driving current supplied to the light emitting element 350 according to the voltage charged in the storage capacitor Cst. That is, the first switching element TR1 may be a switching transistor, and the second switching element TR2 may be a driving transistor.

One end of the light emitting element 350, connected to the first electrode 310, may be electrically connected to the second electrode of the second switching element TR2. The light emitting element 350 may receive a current through the second electrode of the second switching element TR2. The other end of the light emitting element 350, connected to the second electrode 320, may be electrically connected to a second driving voltage line QVSSL, and thus the light emitting element 350 may receive a second driving voltage QVSS. The first driving voltage QVDD may have a higher voltage level than the second driving voltage QVSS.

Meanwhile, although it is shown in FIG. 3 that the display device 10 includes two switching elements, that is, the first switching element TR1 and the second switching element TR2, and one capacitor, that is, the storage capacitor Cst, the present invention is not limited thereto. In some embodiments, the display device 10 may include a larger number of switching elements. Although not shown in the drawings, the display device may also include seven switching elements different from each other, one driving switching element, and one storage capacitor.

Hereinafter, more specific structures of a plurality of members disposed on the display device 10 will be described with reference to FIG. 4.

Figure 4:
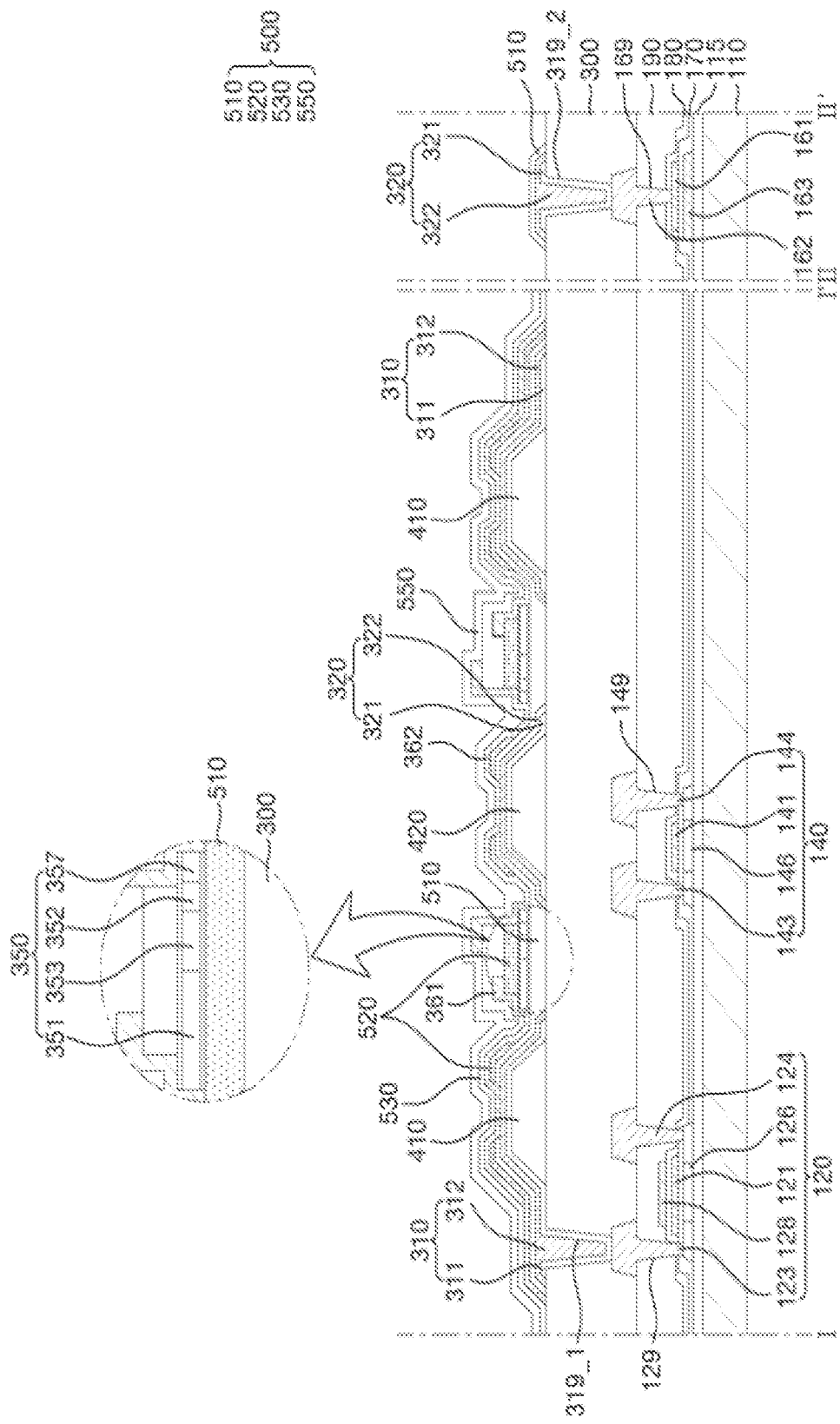
FIG. 4 is a cross-sectional view taken along the lines I-I' and II-II' of FIG. 1.

FIG. 4 is a cross-sectional view taken along the lines I-I' and II-II' of FIG. 1. Although FIG. 4 shows only one pixel PX, it may be applied to other pixels as well.

Referring to FIGS. 1 to 4, the display device 10 may include a substrate 110, thin film transistors 120 and 140 disposed on the substrate 110, electrodes 310 and 320 disposed on the thin film transistors 120 and 140. The thin film transistors may include a first thin film transistor 120 and a second thin film transistor 140, which may be a driving transistor and a switching transistor, respectively. Each of the thin film transistors 120 and 140 may include an active layer, a gate electrode, a source electrode, and a drain electrode. The first electrode 310 may be electrically connected to the drain electrode of the first thin film transistor 120.

More specifically, the substrate 110 may be an insulating substrate. The substrate 110 may be made of an insulating material such as glass, quartz, or a polymer resin. Examples of the polymer resin may include polyethersulphone (PES), polyacrylate (PA), polyarylate (PAR), polyetherimide (PEI), polyethylene napthalate (PEN), polyethylene terepthalate (PET), polyphenylene sulfide (PPS), polyallylate, polyimide (PI), polycarbonate (PC), cellulose triacetate (CAT), cellulose acetate propionate (CAP), and combinations thereof. The substrate 110 may be a rigid substrate, but may be a flexible substrate capable of bending, folding, rolling, or the like.

A buffer layer 115 may be disposed on the substrate 110. The buffer layer 115 may prevent the diffusion of impurity ions, may prevent the penetration of moisture or external air, and may perform a surface planarization function. The buffer layer 115 may include silicon nitride, silicon oxide, or silicon oxynitride.

A semiconductor layer is disposed on the buffer layer 115. The semiconductor layer may include a first active layer 126 of the first thin film transistor 120, a second active layer 146 of the second thin film transistor 140, and an auxiliary layer 163. The semiconductor layer may include polycrystalline silicon, monocrystalline silicon, an oxide semiconductor, or the like.

A first gate insulating layer 170 is disposed on the semiconductor layer. The first gate insulating layer 170 covers the semiconductor layer. The first gate insulating layer 170 may function as a gate insulating film of the thin film transistor. The first gate insulating layer 170 may include silicon oxide, silicon nitride, silicon oxynitride, aluminum oxide, tantalum oxide, hafnium oxide, zirconium oxide, titanium oxide, or the like. These compounds may be used alone or in combination with each other.

A first conductive layer is disposed on the first gate insulating layer 170. The first conductive layer may include a first gate electrode disposed on the first active layer 126 of the first thin film transistor 120, a second gate electrode disposed on the second active layer 146 of the second thin film transistor 140, and a power supply wiring 161 disposed on the auxiliary layer 163, with the first gate insulating layer 170 therebetween. The first conductive layer may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first conductive layer may be a single-layer film or a multilayer film.

A second gate insulating layer 180 is disposed on the first conductive layer. The second gate insulating layer 180 may be an interlayer insulating film. The second gate insulating layer 180 may include an inorganic insulating material such as silicon oxide, silicon nitride, silicon oxynitride, hafnium oxide, aluminum oxide, titanium oxide, tantalum oxide, or zinc oxide.

A second conductive layer is disposed on the second gate insulating layer 180. The second conductive layer includes a capacitor electrode 128 disposed on the first gate electrode 121 with the second gate insulating layer 180 therebetween. The capacitor electrode 128 may constitute a storage capacitor together with the first gate electrode 121.

Like the first conductive layer, the second conductive layer may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

An interlayer insulating layer 190 is disposed on the second conductive layer. The interlayer insulating layer 190 may be an interlayer insulating film. Moreover, the interlayer insulating layer 190 may perform a surface planarization function. The interlayer insulating layer 190 may include an organic insulating material such as polyacrylate resin, epoxy resin, phenolic resin, polyamide resin, polyimide rein, unsaturated polyester resin, polyphenyleneether resin, polyphenylenesulfide resin, or benzocyclobutene (BCB).

A third conductive layer is disposed on the interlayer insulating layer 190. The third conductive layer includes a first drain electrode 123 and first source electrode 124 of the first thin film transistor 120, a second drain electrode 143 and second source electrode 144 of the second thin film transistor 140, and a power supply electrode 162 disposed on the power supply wiring 161.

Each of the first source electrode 124 and the first drain electrode 123 may be electrically connected to the first active layer 126 through a first contact hole 129 penetrating the interlayer insulating layer 190 and the second gate insulating layer 180. Each of the second source electrode 144 and the second drain electrode 143 may be electrically connected to the second active layer 146 through a second contact hole 149 penetrating the interlayer insulating layer 190 and the second gate insulating layer 180. The power supply electrode 162 may be electrically connected to the power supply wiring 161 through a third contact hole 169 penetrating the interlayer insulating layer 190 and the second gate insulating layer 180.

The third conductive layer may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The third conductive layer may be a single-layer film or a multilayer film. For example, the third conductive layer may be formed of a laminate structure of Ti/Al/Ti, Mo/Al/Mo, Mo/AlGe/Mo, or Ti/Cu.

An insulating substrate layer 300 is disposed on the third conductive layer. The insulating substrate layer 300 may include an organic insulating material such as polyacrylate resin, epoxy resin, phenolic resin, polyamide resin, polyimide rein, unsaturated polyester resin, polyphenyleneether resin, polyphenylenesulfide resin, or benzocyclobutene (BCB). The surface of the insulating substrate layer 300 may be flat.

A plurality of partition walls 410 and 420 may be disposed on the insulating substrate layer 300. The plurality of partition walls 410 and 420 are disposed to be spaced apart from each other and face each other in each of the pixels PX, and the first electrode 310 and the second electrode 320 may be disposed on the partition walls 410 and 420 spaced apart from each other, for example, a first partition wall 410 and a second partition wall 420. FIGS. 1 and 4 show a case where three partition walls 410 and 420, specifically, two first partition walls 410 and one second partition wall 420 are disposed in one pixel PX, and thus two first electrodes 310 and one second electrode 320 are disposed.

However, the present invention is not limited thereto, and a larger number of partition walls 410 and 420 may be disposed in one pixel PX. For example, a larger number of partition walls 410 and 420 may be disposed in one pixel PX, and thus a larger number of first and second electrodes 310 and 320 may be disposed. The partition walls 410 and 420 may include at least one first partition wall 410 on which the first electrode 310 is disposed, and at least one second partition wall 420 on which the second electrode 320 is disposed. In this case, the first partition wall 410 and the second partition wall 420 may be disposed to be spaced apart from each other and face each other, and the plurality of partition walls may be alternately arranged in one direction. In some embodiments, two first partition walls 410 may be disposed to be spaced apart from each other, and one second partition wall 420 may be disposed between the spaced first partition walls 410.

Meanwhile, the plurality of partition walls 410 and 420 may be made of substantially the same material, and thus may be formed in one process. In this case, the partition walls 410 and 420 may form one lattice pattern. The partition walls 410 and 420 may include polyimide (PI).

Meanwhile, although not shown in the drawings, at least some of the plurality of partition walls 410 and 420 may be disposed at the boundary between the respective pixels PX to distinguish them from each other. These partition walls may be substantially arranged in a lattice pattern together with the first partition wall 410 and second partition wall 420 described above. At least some of the plurality of partition walls 410 and 420 disposed at the boundary between the respective pixels PX may be disposed to cover the electrode lines of the display device 10.

The reflective layers 311 and 321 may be disposed on the plurality of partition walls 410 and 420.

The first reflective layer 311 covers the first partition wall 410, and is electrically connected to the first drain electrode 123 of the first thin film transistor 120 through a fourth contact hole 319_1 penetrating the insulating substrate layer 300. The second reflective layer 321 covers the second partition wall 420, and is electrically connected to the power supply electrode 162 through a fifth contact hole 319_2 penetrating the insulating substrate layer 300.

The first reflective layer 311 may be electrically connected to the first drain electrode 123 of the first thin film transistor 120 through the fourth contact hole 319_1 in the pixel PX. Therefore, the first thin film transistor 120 may be disposed in a region overlapping the pixel PX. It is shown in FIG. 1 that the first reflective layer 311 is electrically connected to the first thin film transistor 120 through the first electrode contact hole CNTD disposed on the first electrode stem portion 310S. That is, the first electrode contact hole CNTD may be the fourth contact hole 319_1.

The second reflective layer 321 may also be electrically connected to the power supply electrode 162 through the fifth contact hole 319_2 in the pixel PX. It is shown in FIG. 4 that the second reflective layer 321 is electrically connected to the power supply electrode 162 through the fifth contact hole 319_2 in one pixel PX. It is shown in FIG. 1 that the second electrode 320 of each pixel PX is electrically connected to the power supply wiring 161 through the plurality of second electrode contact holes CNTS on the second electrode stem portion 320S. That is, the second electrode contact hole CNTS may be the fifth contact hole 319_2. However, the present invention is not limited thereto. For example, in FIG. 1, the second electrode contact hole CNTS may be disposed at various positions even on the second electrode stem portion 320S, and in some cases, the second electrode contact hole CNTS may be disposed on the second electrode branch portion 320B. Further, in some embodiments, the second reflective layer 321 may be connected to one second electrode contact hole CNTS or one fifth contact hole 319_2 in a region other than the pixel PX.

FIG. 6 is a plan view of a display device according to another embodiment.

The display device 10 may include an area other than the light-emitting area where the light emitting elements 350 are disposed, for example, a non-light emitting area where the light emitting elements 350 are not disposed. As described above, the second electrodes 320 of each pixel PX are electrically connected to each other through the second electrode stem portion 320S, so as to receive the same electrical signal.

Referring to FIG. 6, in some embodiments, in the case of the second electrode 320, the second electrode stem portion 320S may be electrically connected to the power supply electrode 162 through one second electrode contact hole CNTS in the non-light emitting area located at the outside of the display device 10. Unlike the display device 10 of FIG. 1, even when the second electrode stem portion 320S is connected to the power supply electrode 162 through one contact hole, the second electrode stem portion 320S is extended to the adjacent pixel PX and is electrically connected, so that the same electric signal may be applied to the second electrode branch portion 320B of each pixel PX. In the case of the second electrode 320 of the display device 10, the position of the contact hole for receiving an electric signal from the power supply electrode 162 may vary according to the structure of the display device 10.

Meanwhile, referring to FIGS. 1 and 4 again, each of the reflective layers 311 and 321 may include a high-reflectance material to reflect the light emitted from the light emitting element 350. For example, each of the reflective layers 311 and 321 may include a material such as silver (Ag) or copper (Cu), but the present invention is not limited thereto.

At least some of the plurality of partition walls 410 and 420 may have a structure protruding from the insulating substrate layer 300. The partition walls 410 and 420 may protrude upward from the plane on which the light emitting elements are arranged, and at least some of the protruding portions may have an inclination. The partition walls 410 and 420 having a protruding structure with an inclination may reflect the light incident on reflective layers 311 and 321 disposed on the partition walls 410 and 420. The light directed from the light emitting elements 350 toward the reflective layers 311 and 321 may be reflected and then transmitted to the outside of the display device 10, for example, above the partition walls 410 and 420.

A first electrode layer 312 and a second electrode layer 322 may be disposed on the first reflective layer 311 and the second reflective layer 321, respectively.

The first electrode layer 312 is disposed directly on the first reflective layer 311. The first electrode layer 312 may have substantially the same pattern as the first reflective layer 311. The second electrode layer 322 is disposed directly on the second reflective layer 321 and spaced apart from the first electrode layer 312. The second electrode layer 322 may have substantially the same pattern as the second reflective layer 321.

In an embodiment, the electrode layers 312 and 322 may cover the underlying reflective layers 311 and 321, respectively. That is, the electrode layers 312 and 322 may be formed to be larger than the reflective layers 311 and 321 to cover the side surfaces of ends of the reflective layers 311 and 321. However, the present invention is not limited thereto.

The first electrode layer 312 and the second electrode layer 322 may transmit the electric signals transmitted to the first reflective layer 311 and second reflective layer 321 connected to the first thin film transistor 120 or the power supply electrode 162 to contact electrodes to be described later. The electrode layers 312 and 322 may include a transparent conductive material. For example, the electrode layers 312 and 322 may include a material such as indium tin oxide (ITO), indium zinc oxide (IZO), or indium tin-zinc oxide (ITZO), but the present invention is not limited thereto. In some embodiments, the reflective layers 311 and 321 and the electrode layers 312 and 322 may have a structure in which a transparent conductive layer such as ITO, IZO, or ITZO and a metal layer such as silver or copper are laminated one or more layers. For example, the reflective layers 311 and 321 and the electrode layers 312 and 322 may have a laminate structure of ITO/silver (Ag)/ITO.

The first reflective layer 311 and the first electrode layer 312, which are disposed on the first partition wall 410, constitute the first electrode 310. The first electrode 310 may protrude to a region extending from both ends of the first partition wall 410, and thus the first electrode 310 may be in contact with the insulating substrate layer 300 in the protruding region. The second reflective layer 321 and the second electrode layer 322, which are disposed on the second partition wall 420, constitute the second electrode 320. The second electrode 320 may protrude to a region extending from both ends of the second partition wall 420, and thus the second electrode 320 may be in contact with the insulating substrate layer 300 in the protruding region.

The first electrode 310 and the second electrode 320 may be disposed to cover the entire region of the first partition wall 410 and the entire region of the second partition wall 420, respectively. However, as described above, the first electrode 310 and the second electrode 320 are spaced apart from each other and face each other. As will be described later, a first insulating layer 510 may be disposed between the first electrode 310 and second electrode 320 spaced apart from each other, and the light emitting element 350 may be disposed on the first insulating layer 510.

The first reflective layer 311 may receive a driving voltage from the first thin film transistor 120, and the second reflective layer 321 may receive a power supply voltage from the power supply wiring 161, so that the first electrode 310 and the second electrode 320 receive a driving voltage and a power supply voltage, respectively. As will be described later, the first electrode 310 may be electrically connected to the first thin film transistor 120, and the second electrode 320 may be electrically connected to the power supply wiring 161. Accordingly, the first contact electrode 361 and the second contact electrode 362 disposed on the first electrode 310 and the second electrode 320 may receive the driving voltage and the power supply voltage. The driving voltage and the power supply voltage are transmitted to the light emitting element 350, and current flows through the light emitting element 350, so as to emit light.

The first insulating layer 510 is disposed on a part of the first electrode 310 and a part of the second electrode 320. The first insulating layer 510 may be disposed in a space between the first electrode 310 and second electrode 320. The first insulating layer 510 may have an island shape or a linear shape along a space between the first electrode branch portion 310B and the second electrode branch portion 320B in a plan view.

The light emitting element 350 is disposed on the first insulating layer 510. The first insulating layer 510 may be disposed between the light emitting element 350 and the insulating substrate layer 300. The lower surface of the first insulating layer 510 may be in contact with the insulating substrate layer 300, and the light emitting element 350 may be disposed on the upper surface of the first insulating layer 510. Further, the first insulating layer 510 may be disposed to cover the ends of the electrodes 310 and 320 facing each other, so as to electrically insulate them from each other.

The first insulating layer 510 may overlap a part of a region on each of the electrodes 310 and 320, for example, a part of a region protruding in a direction in which the first electrode 310 and the second electrode 320 face each other.

The first insulating layer 510 may be disposed even on the upper surfaces of the partition walls 410 and 420 among the regions on the electrodes 310 and 320. Accordingly, the lower surface of the first insulating layer 510 may be in contact with the insulating substrate layer 300 and the electrodes 310 and 320. A part of the upper surface of each of the electrodes 310 and 320, the upper surface being not provided with the first insulating layer 510, may be exposed. The light emitting element 350 may be disposed on the first insulating layer 510 so that both sides thereof are exposed. Therefore, the contact electrodes 361 and 362 to be described later may be in contact with the exposed upper surfaces of the electrodes 310 and 320 and both sides of the light emitting element 350.

For example, the first insulating layer 510 may cover the upper surface of a region that protrudes in a direction in which the first electrode 210 and the second electrode 220 face each other. The first insulating layer 510 may protect the regions overlapping the electrodes 210 and 220, and electrically insulate them from each other. Further, the first insulating layer 510 may prevent the first conductive semiconductor layer 351 and second conductive semiconductor layer 352 of the light emitting element 350 from being in direct contact with other substrates to prevent the damage of the light emitting element 350.

At least one light emitting element 350 may be disposed between the first electrode 310 and the second electrode 320. Although it is illustrated in FIG. 1 that only the light emitting elements 350 emitting light of the same color are arranged in each pixel PX, the present invention is not limited thereto. As described above, the light emitting elements 350 emitting light of different colors from each other may be arranged in one pixel PX.

As described above, the length h of the long axis of the light emitting element 350 may be longer than the distance between the first electrode 310 and the second electrode 320, for example, the distance I1 between the sides of the first electrode 310 and the second electrode 320, the sides facing each other, but may be shorter than the distance I2 between the centers of the first electrode 310 and the second electrode 320. Accordingly, one end of the light emitting element 350 may be in contact with the first electrode 310, and the other end may be in contact with the second electrode 320. Further, both ends of the light emitting element 350 may be easily in electrical contact with the contact electrodes 361 and 362 to be described later.

The light emitting element 350 may be a light emitting diode. The light emitting element 350 may be a nanostructure whose size is generally nanometer. The light emitting element 350 may be an inorganic light emitting diode including an inorganic material. In the case where the light emitting element 350 is an inorganic light emitting diode, when a light emitting material having an inorganic crystal structure is disposed between two electrodes facing each other and an electric field is formed in the light emitting material in a specific direction, the inorganic light emitting diode may be aligned between the two electrodes in which a specific polarity is formed.

Referring to the enlarged view of FIG. 4, as will be described later, in some embodiments, the light emitting element 350 may have a structure in which a first conductive semiconductor layer 351, an active material layer 353, a second conductive semiconductor layer 352, and an electrode material layer 357 are laminated. In the laminating order of the light emitting element 350, the first conductive semiconductor layer 351, the active material layer 353, the second conductive semiconductor layer 352, and the electrode material layer 357 are arranged in a direction horizontal to the insulating substrate layer 300. In other words, the light emitting element 350, in which the plurality of layers are laminated, may be disposed in a horizontal direction horizontal to the insulating substrate layer 300.

In an embodiment, the first conductive semiconductor layer 351 of the light emitting element 350 may be electrically connected to the first electrode 310 or one side of the first electrode 310 facing the second electrode 320, and the second conductive semiconductor layer 352 or electrode material layer 357 of the light emitting element 350 may be electrically connected to the other side of the first electrode 310 or the second electrode 320. For example, when the first electrode 310 is a cathode electrode and the second electrode 320 is an anode electrode, electrons may be injected into the first conductive semiconductor layer 351 of the light emitting element 350, and holes may be injected into the second conductive semiconductor layer 352 or electrode material layer 357 of the light emitting element 350. The electrons and holes injected into the light emitting element 350 may be recombined in the active material layer 353 to emit light of a specific wavelength band. However, the present invention is not limited thereto. In some cases, the first conductive semiconductor layer 351 of the light emitting element 350 may be electrically connected to the second electrode 320, and the second conductive semiconductor layer 352 thereof may be electrically connected to the first electrode 310. A more detailed description of the structure of the light emitting element 350 will be described later.

The second insulating layer 520 may be disposed on the first insulating layer 510, and may overlap the first electrode 310, the second electrode 320, and at least a part of the light emitting element 350. As described above, the second insulating layer 520 may include an opening 520P such that a part of the first insulating layer 510 is exposed. This opening 520P may be formed by forming the second insulating layer 520 so as to cover the entire first insulating layer 510 and then patterning the second insulating layer 520 during the process of manufacturing the display device 10.

In this case, the second insulating layer 520 may function to protect and fix the light emitting elements 350 aligned between the first electrode 310 and the second electrode 320. Although not shown in the drawings, the second insulating layer 520 may be disposed on the upper surface and outer surface of the light emitting element 350. However, both side surfaces of the light emitting element 350 are disposed to be exposed. That is, since the length of the second insulating layer 520 disposed on the upper surface of the light emitting element 350 in the cross-section, measured in the uniaxial direction, is shorter than the length of the light emitting element 350, the second insulating layer 520 may be recessed inwardly from both sides of the light emitting element 350. Accordingly, the side surfaces of the first insulating layer 510, the light emitting element 350, and the second insulating layer 520 may be laminated stepwise. In this case, the contact electrodes 361 and 362 to be described later may be brought into smooth contact with both ends of the light emitting element 350. However, the present invention is not limited thereto, and the length of the second insulating layer 520 may be matched with the length of the light emitting element 350, so that both sides thereof may be aligned with each other.

The second insulating layer 520 may include the opening 520P to induce the uniform alignment of the plurality of light emitting element 350 between the first electrode 310 and the second electrode 320. The opening 520P may be formed by patterning the second insulating layer 520 through a dry or wet etching process. The first insulating layer 510 and the second insulating layer 520 may include materials having different etching selection ratios from each other to prevent the first insulating layer 510 from being etched when patterning the second insulating layer 520. Accordingly, when the opening 520P is formed by patterning the second insulating layer 520, the first insulating layer 510 may not be damaged. The contact electrodes 361 and 362 to be described later may be brought into contact with the light emitting element 350 on the first insulating layer 510 exposed by the opening 520P.

Figure 5:
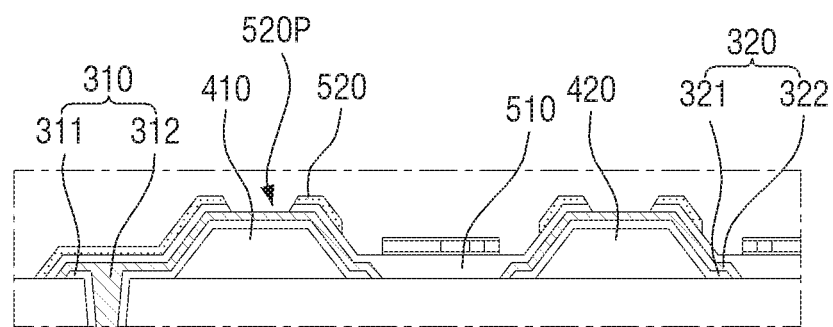
FIG. 5 is a cross-sectional view illustrating a part of the display device of FIG. 1.

FIG. 5 is a cross-sectional view illustrating a part of the display device of FIG. 1. FIG. 5 shows only the first insulating layer 510 and opening 520P disposed on the first electrode 310 and the second electrode 320. Hereinafter, the structure of the cross-section of the opening 520P will be described in more detail with reference to FIG. 5.

The second insulating layer 520 may be disposed on the first insulating layer 510, and the second insulating layer 520 may be patterned to form the opening 520P in a region where the light emitting element 350 is disposed.

The process of forming the opening 520P by patterning the second insulating layer 520 may be performed by a general dry etching or wet etching method. Here, in order to prevent the first insulating layer 510 from being patterned, the first insulating layer 510 and the second insulating layer 520 may include materials having different etching selection ratios from each other. In other words, when patterning the second insulating layer 520, the first insulating layer 510 may function as an etching stopper. Accordingly, the opening 520P may be formed while maintaining the shape of the first insulating layer 510. Details thereof will be described later.

The first insulating layer 510 may be exposed to the outside by the opening 520P, and as described above, the intensity of an electric field by an AC power may be strong in the exposed region. The region where the second insulating layer 520 exists on the first insulating layer 510 may have a weaker electric field than the region exposed by the opening 520P. Accordingly, a spatial variation in the electric field intensity between the region where the second insulating layer 520 exists and the opening 520P may occur. As described above, the spatial variation of the electric field intensity may apply a stronger dielectrophoretic force FDEP to the light emitting element 350, and the light emitting element 350 may be preferentially disposed in the opening 520P.

Meanwhile, among the upper surfaces of the first electrode 310 and the second electrode 320, the region protruded from the insulating substrate layer 300 by the first partition wall 410 and the second partition wall 420 may be exposed by patterning the first insulating layer 510 and the second insulating layer 520. The exposed region may be electrically connected to the first electrode 310 and the second electrode 320 by contacting the contact electrodes 361 and 362 to be described later.

Referring to FIG. 4 again, a first contact electrode 361 disposed on the first electrode 310 and overlapping at least a part of the second insulating layer 520, and a second contact electrode 362 disposed on the second electrode 320 and overlapping at least a part of the second insulating layer 520, may be disposed on the second insulating layer 520.

The first contact electrode 361 may be disposed on the first electrode 310 to cover the first electrode 310, and the lower surface of the first contact electrode 361 may be partially in contact with the light emitting element 350, the first insulating layer 510, and the second insulating layer 520. One end of the first contact electrode 361 in the direction in which the second electrode 320 is disposed may be disposed on the second insulating layer 520.

The second contact electrode 362 may be disposed on the second electrode 320 to cover the second electrode 320, and the lower surface of the second contact electrode 362 may be partially in contact with the light emitting element 350, the first insulating layer 510, and a third insulating layer 530. Both ends of the second contact electrode 362 in the direction in which the first electrode 310 is disposed may be disposed on the third insulating layer 530.

In other words, the first contact electrode 361 and the second contact electrode 362 may be disposed on the upper surfaces of the first electrode 310 and the second electrode 320, respectively. Specifically, the first contact electrode 361 and the second contact electrode 362 may be in contact with the first electrode layer 312 and the second electrode layer 322 on the upper surfaces of the first electrode 310 and the second electrode 320. The region disposed to cover the first electrode 310 and the second electrode 320 on the upper surfaces of the first partition wall 410 and the second partition wall 420 may be patterned to expose the first electrode layer 312 and the second electrode layer 322, and thus the first insulating layer 510 and the second insulating layer 520 may be electrically connected to the respective contact electrodes 361 and 362 in the exposed region.

The first contact electrode 361 and the second contact electrode 362 may be in contact with one end and the other end of the light emitting element 350, for example, the first conductive semiconductor layer 351 and the electrode material layer 357, respectively. Thus, the first contact electrode 361 and the second contact electrode 362 may transmit an electric signal applied to the first electrode layer 312 and the second electrode layer 322 to the light emitting element 350.

The first contact electrode 361 and the second contact electrode 362 may be disposed to be spaced apart from each other on the second insulating layer 520 or the third insulating layer 530. That is, the first contact electrode 361 and the second contact electrode 362 may be in contact with the second insulating layer 520 or the third insulating layer 530 together with the light emitting element 350, but may be spaced apart from each other on the second insulating layer 520 in a laminated direction to be electrically insulated. Accordingly, the first contact electrode 361 and the second contact electrode 362 may receive different power from the first thin film transistor 120 and the power supply wiring 161, respectively. For example, the first contact electrode 361 may receive a driving voltage applied from the first thin film transistor 120 to the first electrode 310, and the second contact electrode 362 may receive a common power supply voltage applied from the power supply wiring 161 to the second electrode 320. However, the present invention is not limited thereto.

The contact electrodes 361 and 362 may include a conductive material. For example, the contact electrodes 361 and 362 may include ITO, IZO, ITZO, or aluminum (Al). However, the present invention is not limited thereto.

Further, the contact electrodes 361 and 362 may include the same material as the electrode layers 312 and 322. The contact electrodes 361 and 362 may be disposed in substantially the same pattern on the electrode layers 312 and 322 so as to be in contact with the electrode layers 312 and 322. For example, the first contact electrode 361 and the second contact electrode 362, which are in contact with the first electrode layer 312 and the second electrode layer 322, may receive an electrical signal applied to the first electrode layer 312 and the second electrode layer 322 and transmit the electrical signal to the light emitting element 350.

The third insulating layer 530 may be disposed on the first contact electrode 361 to electrically insulate the first contact electrode 361 and the second contact electrode 362 from each other. The third insulating layer 530 may disposed to cover the first contact electrode 361, but may be disposed not to overlap a part of the light emitting element 350 such that the light emitting element 350 is in contact with the second contact electrode 362. The third insulating layer 530 may partially contact the first contact electrode 361, the second contact electrode 362, and the second insulating layer 520 on the upper surface of the second insulating layer 520. The third insulating layer 530 may be disposed to cover one end of the first contact electrode 361 on the upper surface of the second insulating layer 520. Thus, the third insulating layer 530 may protect the first contact electrode 361 and electrically insulate the first contact electrode 361 and the second contact electrode 362 from each other.

One end of the third insulating layer 530 in the direction in which the second electrode 320 is disposed may be aligned with one side surface of the second insulating layer 520.

Meanwhile, in some embodiments, the display device 10 may not include the third insulating layer 530. Accordingly, the first contact electrode 361 and the second contact electrode 362 may be disposed on substantially the same plane, and the first contact electrode 361 and the second contact electrode 362 may be electrically insulated from each other by a passivation layer 550 to be described later.

The passivation layer 550 may be formed on the third insulating layer 530 and the second contact electrode 362 to function to protect members disposed on the insulating substrate layer 300 from external environments. When the first contact electrode 361 and the second contact electrode 362 are exposed, a problem of disconnection of a contact electrode material due to electrode damage may occur, so that the passivation may cover these members. That is, the passivation layer 550 may be disposed to cover the first electrode 310, the second electrode 320, the light emitting element 350, and the like. As described above, when the third insulating layer 530 is omitted, the passivation layer 550 may be formed on the first contact electrode 361 and the second contact electrode 362. In this case, the passivation layer 550 may electrically insulate the first contact electrode 361 and the second contact electrode 362 from each other.

Each of the aforementioned first insulating layer 510, second insulating layer 520, third insulating layer 530, and passivation layer 550 may include an inorganic insulating material. For example, the first insulating layer 510, the second insulating layer 520, the third insulating layer 530, and the passivation layer 550 may include an inorganic insulating material such as silicon oxide (SiOx), silicon nitride (SiNx), silicon oxynitride (SiOxNy), aluminum oxide (Al2O3), or aluminum nitride (AlN). The first insulating layer 510, the second insulating layer 520, the third insulating layer 530, and the passivation layer 550 may include the same material, or may include different materials from each other. Besides, various materials imparting insulating properties to the first insulating layer 510, the second insulating layer 520, the third insulating layer 530, and the passivation layer 550 may be applicable.

Meanwhile, the first insulating layer 510 and the second insulating layer 520 may have different etching selection ratios, as described above. For example, when the first insulating layer 510 includes silicon oxide (SiOx), the second insulating layer 520 may include silicon nitride (SiNx). As another example, when the first insulating layer 510 includes silicon nitride (SiNx), the second insulating layer 520 may include silicon oxide (SiOx). However, the present invention is not limited thereto.

Meanwhile, the light emitting elements 350 may be manufactured on a substrate by an epitaxial growth method. The light emitting elements 350 may be manufactured by forming a seed crystal layer for forming a semiconductor layer on a substrate and depositing a desired semiconductor material on the seed crystal layer to grow the seed crystal layer. Hereinafter, a structure of the light emitting element 350 according to various embodiments will be described in detail with reference to FIG. 7.

FIG. 7 is a schematic perspective view of a light emitting element according to an embodiment.

Referring to FIG. 7, the light emitting element 350 may include a plurality of conductive semiconductor layers 351 and 352, an active material layer 353 disposed between the plurality of conductive semiconductor layers 351 and 352, an electrode material layer 357, and an insulating material layer 358. The electrical signal applied from the first electrode 310 and the second electrode 320 may be transmitted to the active material layer 353 through the plurality of conductive semiconductor layers 351 and 352 to emit light.

Specifically, the light emitting element 350 may include a first conductive semiconductor layer 351, a second conductive semiconductor layer 352, an active material layer 353 disposed between the first conductive semiconductor layer 351 and the second conductive semiconductor layer 352, an electrode material layer 357 disposed on the second conductive semiconductor layer 352, and an insulating material layer 358. Although it is shown in FIG. 7 that the light emitting element 350 has a structure in which the first conductive semiconductor layer 351, the active material layer 353, the second conductive semiconductor layer 352, and the electrode material layer 357 are sequentially laminated, the present invention is not limited thereto. The electrode material layer 357 may be omitted, and in some embodiments, the electrode material layer may also be disposed on at least one of both side surfaces of the first conductive semiconductor layer 351 and the second conductive semiconductor layer 352. Hereinafter, the light emitting element 350 of FIG. 7 will be described as an example.

The first conductive semiconductor layer 351 may be an n-type semiconductor layer. For example, when the light emitting element 350 emits light of a blue wavelength band, the first conductive semiconductor layer 351 may be a semiconductor material having Formula of $In_xAl_yGa_{1-x-y}N$ ($0 \leq x \leq 1$, $0 \leq y \leq 1$, $0 \leq x+y \leq 1$). For example, the semiconductor material may be at least one of InAlGaN, GaN, AlGaN, InGaN, AlN, and InN, which are doped with an n-type semiconductor. The first conductive semiconductor layer 351 may be doped with a first conductive dopant, and, for example, the first conductive dopant may be Si, Ge, Sn, or the like. The length of the first conductive semiconductor layer 351 may be in the range of 1.5 μm to 5 μm, but is not limited thereto.

The second conductive semiconductor layer 352 may be a p-type semiconductor layer. For example, when the light emitting element 350 emits light of a blue wavelength band, the second conductive semiconductor layer 352 may be a semiconductor material having Formula of $In_xAl_yGa_{1-x-y}N$ ($0 \leq x \leq 1$, $0 \leq y \leq 1$, $0 \leq x+y \leq 1$). For example, the semiconductor material may be at least one of InAlGaN, GaN, AlGaN, InGaN, AlN, and InN, which are doped with a p-type semiconductor. The second conductive semiconductor layer 352 may be doped with a second conductive dopant, and, for example, the second conductive dopant may be Mg, Zn, Ca, Se, Ba, or the like. The length of the second conductive semiconductor layer 352 may be in the range of 0.08 μm to 0.25 μm, but is not limited thereto.

The active material layer 353 may be disposed between the first conductive semiconductor layer 351 and the second conductive semiconductor layer 352, and may include a material having a single or multiple quantum well structure. When the active material layer 353 includes a material having a multiple quantum well structure, the multiple quantum well structure may be a structure in which a plurality of quantum layers and a plurality of well layers are alternately laminated. The active material layer 353 may emit light by coupling of electron-hole pairs according to an electrical signal applied through the first conductive semiconductor layer 351 and the second conductive semiconductor layer 352. For example, when the active material layer 353 emits light of a blue wavelength band, it may include a material such as AlGaN or AlInGaN. In particular, when the active material layer 353 has a multiple quantum well structure in which a plurality of quantum layers and a plurality of well layers are alternately laminated, the quantum layer may include a material such as AlGaN or AlInGaN, and the well layer may include a material such as GaN or AlGaN. However, the present invention is not limited thereto. The active material layer 353 may have a structure in which semiconductor materials having high bandgap energy and semiconductor materials having low bandgap energy are alternately laminated, and may include other Group III-V semiconductor materials depending on the wavelength band of the emitted light. Accordingly, the light emitted from the active material layer 353 is not limited to light of a blue wavelength band, and in some cases, the active material layer 353 may emit light of a red wavelength band or light of a green wavelength band. The length of the active material layer 353 may be in the range of 0.05 μm to 0.25 μm, but is not limited thereto.

The light emitted from the active material layer 353 may be emitted not only onto the outer surface of the light emitting element 350 in the length direction but also onto both side surfaces thereof. That is, the direction of the light emitted from the active material layer 353 is not limited to one direction.

The electrode material layer 357 may be an ohmic contact electrode. However, the present invention is not limited thereto, and the electrode material layer 357 may be a Schottky contact electrode. The electrode material layer 357 may include a conductive metal. For example, the electrode material layer 357 may include at least one of aluminum (Al), titanium (Ti), indium (In), gold (Au), and silver (Ag). The electrode material layer 357 may include the same material, and may also include different materials. However, the present invention is not limited thereto.

The insulating material layer 358 may be formed at the outside of the light emitting element 350 to protect the light emitting element 350. For example, the insulating material layer 358 is formed to surround the side surface of the light emitting element 350, and thus may not be formed at both ends of the light emitting element 350 in the length direction, for example, at both ends thereof at which the first conductive semiconductor layer 351 and the second conductive semiconductor layer 352 are disposed. However, the present invention is not limited thereto. The insulating material layer 358 may include a material having insulating properties such as silicon oxide (SiOx), silicon nitride (SiNx), silicon oxynitride (SiOxNy), aluminum nitride (AlN), or aluminum oxide (Al2O3). Accordingly, it is possible to prevent an electrical short that may occur when the active material layer 353 is in direct contact with the first electrode 310 or the second electrode 320.

The insulating material layer 358 may extend in the length direction to cover the first conductive semiconductor layer 351 to the electrode material layer 357. However, the present invention is not limited thereto. The insulating material layer 358 may cover only the first conductive semiconductor layer 351, the active material layer 353, and the second conductive semiconductor layer 352, or may cover only a part of the outer surface of the electrode material layer 357 to expose a part of the outer surface of the electrode material layer 357.

Further, in some embodiments, the insulating material layer 358 may be surface-treated so as to be dispersed in a solution without being agglomerated with another insulating material layer 358. When aligning the light emitting elements to be described later, the light emitting elements 350 in the solution are maintained in a dispersed state, so that the light emitting elements 350 may be aligned between the first electrode 310 and the second electrode 320 without being agglomerated with each other. For example, the insulating material layer 358 may be hydrophobically or hydrophilically surface-treated, so that the light emitting elements 350 may be maintained in a state in which the light emitting elements 350 are dispersed with each other in the solution.

The length of the insulating material layer 358 may be in the range of 0.5 μm to 1.5 μm, but is not limited thereto.

The light emitting element 350 may be cylindrical. However, the shape of the light emitting element 350 is not limited thereto, and may have various shapes such as a cube, a rectangular parallelepiped, and a hexagonal column. The length of the light emitting element 350 may be in the range of 1 μm to 10 μm or 2 μm to 5 μm, and preferably may be about 4 μm. The diameter of the light emitting element 350 may be in the range of 400 nm to 700 nm, and preferably may be about 500 nm.

Hereinafter, a method of manufacturing a display device 10 according to an embodiment will be described in detail with reference to FIGS. 8 to 12.

FIGS. 8 to 12 are plan views schematically illustrating a method of manufacturing a display device according to an embodiment.

First, referring to FIG. 8, a plurality of electrodes 310 and 320 are formed on the insulating substrate layer 300. The process of forming the plurality of electrodes 310 and 320 may be performed by patterning a metal or an organic material through a general mask process.

As described above with reference to FIG. 1, the first electrode stem portion 310S and the second electrode stem portion 320S extend in the first direction D1, and are disposed to be spaced apart from each other and face each other. Although it is shown in FIG. 1 that the first electrode stem portions 310S are electrically separated and spaced apart from each other between neighboring pixels PX, in FIG. 8, one end of the first electrode stem portion 310S may also extend to a plurality of adjacent pixels PX. One end of the first electrode stem portion 310S and one end of the second electrode stem portion 320S may be connected to a signal application pad (not shown), and thus AC power may be applied when aligning the light emitting elements 350, which will be described later.

The first electrode branch portion 310B and the second electrode branch portion 320B are branched from the first electrode stem portion 310S and the second electrode stem portion 320S, respectively, and extend in the second direction D2. As described above, the first electrode branch portion 310B and the second electrode branch portion 320B extend in directions opposite to each other, and are terminated in a state of being spaced apart from the first electrode stem portion 310S and the second electrode stem portion 320S.

That is, the first electrode 310 of FIG. 8 is the same as the first electrode 310 of FIG. 1 except that the first electrode stem portion 310S extends to the neighboring pixel PX and is electrically connected to the first electrode stem portion 310S of each pixel PX. A detailed description thereof will be omitted. Although not shown in the drawings, the first insulating layer 510 of FIG. 4 may be disposed on the first electrode 310 and the second electrode 320. The first insulating layer 510 may be disposed to cover a part of the first electrode 310 and a part of the second electrode 320 as described above, and may protect or electrically insulate them.

Next, referring to FIG. 9, a second insulating layer 520 is formed on the electrodes 310 and 320 and the first insulating layer 510 (shown in FIG. 4).

An opening 520P may be formed in the second insulating layer 520 by a process to be described later. The process of forming the second insulating layer 520 may be performed by a general patterning method. Although it is shown in FIG. 8 that the second insulating layer 520 is disposed to cover a part of the first electrode branch portion 310B and a part of the second electrode branch portion 320B, the present invention is not limited thereto. In some cases, the second insulating layer 520 may be disposed to cover all of the first electrode branch portion 310B and the second electrode branch portion 320B, or may cover the first electrode stem portion 310S and the second electrode stem portion 320S. Meanwhile, as described above, the second insulating layer 520 may include a material having a different etching selection ratio from the first insulating layer 510.

Next, referring to FIG. 10, openings 520P are formed by patterning a part of the second insulating layer 520. The arrangement and structure of the openings 520P are the same as those having been described above with reference to FIGS. 1 and 2. A detailed description thereof will be omitted.

Next, referring to FIG. 11, a plurality of light emitting elements 350 are disposed in the openings 520P in a region where the first electrode branch portion 310B and the second electrode branch portion 320B overlap each other.

Specifically, although not shown in the drawings, a solution including the light emitting elements 350 is applied between the first electrode branch portion 310B and the second electrode branch portion 320B. Then, an AC power is applied from a signal application pad (not shown) connected to one end of the first electrode stem portion 310S and one end of the second electrode stem portion 320S to align the light emitting elements 350.

The AC power applied from a signal application pad (not shown) may form a capacitance due to an electric field between the first electrode branch portion 310B and the second electrode branch portion 320B. The light emitting elements 350 in the applied solution may be subjected to a dielectrophoresis force (DEP force) by a capacitance due to an electric field. The light emitting elements 350 may be aligned between the first electrode branch portion 310B and the second electrode branch portion 320B by the dielectrophoretic force. One end of the light emitting element 350 receiving the DEP force may be connected to the first electrode branch portion 310B, and the other end thereof may be connected to both side surfaces of the second electrode branch portion 320B.

The dielectrophoretic force applied to the light emitting element 350 by the capacitance may cause the light emitting element 350 to have certain directionality between the electrodes 310 and 320. For example, the first conductive semiconductor layer 351 of the light emitting element 350 may be connected to the first electrode branch portion 310B or one side surface of the first electrode 310 in the direction of the second electrode branch portion 320B, and the second conductive semiconductor layer 352 of the light emitting element 350 may be connected to the second electrode branch portion 320B or the other side surface of the first electrode 310. However, the present invention is not limited thereto, and the light emitting elements 350 may be aligned in any direction between the electrodes 310 and 320.

Further, on the first electrode 310 and the second electrode 320, the intensity of an electric field generated by an AC power by the opening 520P may be different.

Specifically, the first insulating layer 510 in a region overlapping the opening 520P may be exposed to the outside, and a region other than the region may be covered by the second insulating layer 520. When an AC power is applied between the first electrode 310 and the second electrode 320, a strong electrical field is formed in the region where the first insulating layer 510 is exposed to the outside, and a weak electrical field is formed in the region covered by the second insulating layer 520. Accordingly, a spatial variation of intensity of an electric field may occur between the plurality of openings 520P, and the spatial variation of intensity of an electric field may change the dielectrophoretic force FDEP applied to the light emitting element 350. A stronger dielectrophoretic force FDEP is applied on the opening 520P having a strong electric field, and the light emitting elements 350 may be preferentially aligned on the opening 520P.

Here, the intensity of an electric field may vary depending on the material and thickness of the second insulating layer 520, the kind of the solution including the light emitting elements 350, and the like. In an exemplary embodiment, the solution including the light emitting elements 350 may include propylene glycol, and the second insulating layer 520 may include silicon oxide (SiOx) or polyimide (PI). The thickness of the second insulating layer 520 may be 0.3 μm to 2.0 μm. In this case, the dielectrophoretic force FDEP applied to the light emitting element 350 may be 7 to 32 times larger in the opening 520P. That is, the light emitting elements 350 may be aligned only in the opening 520P, and may not be aligned on the second insulating layer 520.

A detailed description of the arrangement of the light emitting elements 350 is as described above with reference to FIG. 1.

Next, referring to FIG. 12, the light emitting elements 350 are aligned between the electrodes 310 and 320, and then contact electrodes 361 and 362 are formed on the electrodes 310 and 320 to be in contact with the light emitting elements 350. Although not shown in the drawings, as shown in FIG. 4, a plurality of insulating layers may be disposed on each of the electrodes 310 and 320. The contact electrodes 361 and 362 may be in contact with both sides of the light emitting element 350 and the upper surface of the partition walls 410 and 420 of the respective electrodes 310 and 320, as described above.

Finally, as shown in FIG. 12, the first electrode stem portion 310S may be electrically separated along cutting portions CB, so as to manufacture the display device 10 of FIG. 1. The method of electrically separating the first electrode stem portion 310S is not particularly limited. For example, the first electrode 310 located at the cut portion CB may be disconnected by using a laser. Accordingly, the first electrode stem portion 310S may be disposed in a state where the first electrode stem portion 310S is electrically separated between the neighboring pixels PX.

The first electrode 310 and the second electrode 320 may be electrically connected to the first thin film transistor 120 and the power supply electrode 162 through the first electrode contact hole CNTD on the first electrode stem portion 310S and the second electrode contact hole CNTS on the second electrode stem portion 320S. Accordingly, a current due to a driving voltage and a power supply voltage may flow between the first electrode 310 and the second electrode 320, and the light emitting element 350 may emit light.

As described above, in the display device 10 according to an embodiment, the opening 520P of the second insulating layer 520 may be formed on the first electrode 310 and the second electrode 320 to allow the light emitting elements 350 to be aligned with a specific region. Thus, the light emitting elements 350 may be uniformly aligned in one pixel PX of the display device 10, uniform luminance may be exhibited for each pixel PX, and it is possible to prevent light from being separated and emitted from one pixel PX according to the alignment of the light emitting elements 350.

Hereinafter, other embodiments of the display device 10 will be described.

FIGS. 13 to 15 are plan views schematically illustrating display devices according to other embodiments.

In one embodiment, the opening 520P may be disposed closer to one electrode, for example, the first electrode 310, between the first electrode 310 and the second electrode 320.

Specifically, in the display device 10_1 of FIG. 13, the center of an opening 520P_1 may not be aligned with the center between the first electrode 310 and the second electrode 320, but may be disposed to be moved in the direction of the first electrode 310. Accordingly, the region of the first electrode 310, exposed by the opening 520P_1, may be wider than the region of the second electrode 320, exposed by the opening 520P_1. Therefore, in the display device 10_1 of FIG. 12, the first insulating layer 510 exposed on the first electrode 310 and the second electrode 320 with respect to the opening 520P_1 may have an asymmetric structure.

As described above, the intensity of the electric field formed by an AC power applied for aligning the light emitting elements 350 may be stronger in a region where the exposed first insulating layer 510 is wider. In this case, since the first insulating layer 510 exposed in the region overlapping the first electrode 310 is wider, the spatial variation of intensity of an electric field is larger, and the dielectrophoretic force FDEP applied to the light emitting element 350 may be more strongly affected. Accordingly, the light emitting elements 350 may be more effectively aligned in the opening 520P.

Each of the display device 10_2 of FIG. 14 and the display device 10_3 of FIG. 15 has an opening having a different shape from the opening 520P of the display device 10 of FIG. 1.

Specifically, in the display device 10_2 of FIG. 14, the width d2 of an opening 520P_2, measured in the second direction D2, may become shorter toward the center of each of the electrodes 310 and 320. The width d2_2 of the opening 520P_2, measured at the center of the opening 520P_2 in the second direction D2, is longer than the width d2'_2 of the opening 520P_2, measured at the both ends of the opening 520P_2 in the second direction D2. Accordingly, the opening 520P_2 may be formed such that its vertex has a curvature and is rounded.

However, the present invention is not limited thereto. As shown in FIG. 15, in some embodiments, in the display device 10_3 of FIG. 15, the width d2_3 of an opening 520P_3, measured at the center of the opening 520P_2 in the second direction D2, may be shorter than the width d2'_3 of the opening 520P_2, measured at the both ends of the opening 520P_3 in the second direction D2. When the widths d2_3 and d2'_3 of the opening 520P_3, measured in the second direction D2, are linearly changed, the opening 520P_3 can maximize the spatial variation of the region where the first insulating layer 510 is exposed on each of the electrodes 310 and 320. Accordingly, it is possible to improve the spatial variation of the aforementioned electric field intensity and further improve the alignment effect of the light emitting elements 350.

Although not shown in the drawings, even in the case of the display device 10_2 of FIG. 14 and the display device 10_3 of FIG. 15, like the display device 10_1 of FIG. 13, the opening 520P may be disposed adjacent to either the first electrode 310 or the second electrode 320, so that the exposed first insulating layer 510 may have an asymmetric structure in the region where the first electrode 310 and the second electrode 320 overlap each other. In this case, as described above, a stronger dielectrophoretic force FDEP may be transmitted to the light emitting elements 350 to align the light emitting elements 350 in the opening 520P.

Meanwhile, in the display device 10, the shape of each of the first electrode 310 and the second electrode 320 is not limited to a linear shape or a bar shape as shown in FIG. 1. In some cases, each of the first electrode 310 and the second electrode 320 may have a circular shape or a fan shape.

FIG. 16 is a plan view of a display device according to still another embodiment.

Referring to FIG. 16, unlike the display device 10 of FIG. 1, a display device 10_4 according to still another embodiment may be configured such that a first electrode branch 310B_4 and a second electrode branch 320B_4 may further include connecting portions 310B1_4 and 320B1_4 and counter portions 310B2_4 and 320B2_4, respectively. Since the display device 10_4 of FIG. 16 is the same as the display device 10 of FIG. 1 except that the shapes of the first electrode branch 310B_4 and the second electrode branch 320B_4 are different, differences will be mainly described below.

The second electrode branch portion 320B_4 and may include a second electrode connection portion 320B1_4 branched from the second electrode stem portion 320S_4 and extending in the second direction D2, and a second electrode counter portion 320B2_4 connected to one end of the second electrode connection portion 320B1_4 and having a circular shape in a plane. One end of the second electrode connection portion 320B1_4 may be connected to the second electrode stem portion 320S_4, and the other end thereof may be connected to the second electrode counter portion 320B2_4. The second electrode connection portion 320B1_4 may have substantially the same shape as the second electrode branch portion 320B of FIG. 1.

The second electrode counter portion 320B2_4 may be a region in which the light emitting elements 350 to be described later are arranged in the second electrode branch portion 320B_4. Since the second electrode counter portion 320B2_4 may have a circular shape on a plane, a plurality of light emitting elements 350 may be arranged along the outer surface of the second electrode counter portion 320B2_4. That is, the light emitting elements 350 may not be aligned in one direction but may be aligned in a circle on the second electrode counter portion 320B2_4.

The first electrode branch portion 310B_4 and may include a first electrode connection portion 310B1_4 branched from the first electrode stem portion 310S_4 and extending in the second direction D2, and a first electrode counter portion 310B2_4 connected to one end of the first electrode connection portion 310B1_4, disposed in a circle to cover the outer surface of the second electrode counter portion 320B2_4, and terminated in a state of being spaced apart from the second electrode connection portion 320B1_4. One end of the first electrode connection portion 310B1_4 may be connected to the first electrode stem portion 310S_4, and the other end thereof may be connected to the first electrode counter portion 310B2_4. The first electrode connection portion 310B1_4 may have substantially the same shape as the first electrode branch portion 310B of FIG. 1.

The first electrode counter portions 310B2_4 may be arranged to surround the second electrode counter portions 320B2_4 at a predetermined interval along the outer surface of the second electrode counter portion 320B2_4. That is, since the inner surface of the first electrode counter portion 310B2_4 and the outer surface of the second electrode counter portion 320B2_4 are spaced apart in a circular shape, the first electrode counter portion 310B2_4 has a circular shape whose center is empty, but may be terminated in a state of being spaced apart from the second electrode connection portion 320B1_4. That is, the first electrode counter portion 310B2_4 may have a fan shape with a center angle of 180° or more and an empty center.

The light emitting element 350 may be disposed between the first electrode counter portion 310B2_4 and the second electrode counter portion 320B2_4. One end of the light emitting element 350 may be in contact with the inner surface of the first electrode counter portion 310B2_4, the other end thereof may be in contact with the outer surface of the second electrode counter portion 320B2_4, and the light emitting elements 350 may be arranged in a circle between the first electrode counter portion 310B2_4 and the second electrode counter portion 320B2_4.

The opening 520P_4 may expose the first insulating layer 510 (not shown in FIG. 15) which overlaps a part of the first electrode counter portion 310B2_4 and a part of the second electrode counter portion 320B2_4. In the case of FIG. 15, since the first electrode counter portion 310B2_4 and the second electrode counter portion 320B2_4 are formed in a substantially circular shape, the opening 520P_4 may also have a fan shape like the first electrode counter portion 310B2_4.

In other words, both ends of the opening 520P_4 have a curvature, and the length of one end of the both ends in the center direction of the second electrode counter portion 320B2_4 may be shorter than the length of the other end thereof. In this case, a spatial variation of electric field intensity may occur depending on the difference in length between the both ends of the opening 520P_4, so that the aforementioned dielectrophoretic force FDEP may act strongly in the opening 520P_4. That is, the alignment of the light emitting elements within a certain region may be induced.

However, the present invention is not limited thereto, and the opening 520P_4 may have a substantially rectangular shape having the same length at both ends. Further, as described above, the region exposed by the opening 520P_4 may have a symmetrical or asymmetric structure with respect to the spaced center of the first electrode counter portion 310B2_4 and the second electrode counter portion 320B2_4. A more detailed description thereof will be omitted.

Meanwhile, in some embodiments, the first insulating layer 510 may be omitted.

FIG. 17 is a cross-sectional view schematically showing a part of a display device according to still another embodiment.

In the display device 10 of FIG. 17, the first insulating layer 510 may be omitted, and a patterned second insulating layer 520 may be disposed to expose a part of the first electrode 310 and a part of the second electrode 320 that are spaced apart from each other.

As described above, the first electrode 310 and the second electrode 320 may cause a short failure because electrode materials are connected during a manufacturing process of the display device 10. In order to prevent the short failure, the first insulating layer 510 is formed to protect the first electrode 310 and the second electrode 320 and electrically insulate the first electrode 310 and the second electrode 320. However, in some embodiments, when the electrode materials of the first electrode 310 and the second electrode 320 are not connected during the manufacturing process, for example, when the first electrode 310 and the second electrode 320 include a material such as gold (Au), the first electrode 310 and the second electrode 320 may cause a short failure even if the first insulating layer 510 is omitted. In this case, the first insulating layer 510 is omitted, and the opening 520P (not shown in FIG. 17) is formed only by the second insulating layer 520 to cause a spatial variation of electric field intensity.

Referring to FIG. 17, both ends of the light emitting element 350 may be in direct contact with the first electrode 310 and the second electrode 320 on a region where the first electrode 310 and the second electrode 320 protrude in directions facing each other. Although not shown in the drawings, the opening 520P of the second insulating layer 520 may expose a part of the first electrode 310 and a part of the second electrode 320 to the outside. The region exposed to the outside is a region where the intensity of an electric field is strong, and the spatial variation of the electric field intensity is large due to the opening portion 520P. Accordingly, the light emitting element 350 may be disposed to be in direct contact with the first electrode 310 and the second electrode 320.

The plurality of members such as the contact electrodes 361 and 362, the third insulating layer 530, and the passivation layer 550, which are disposed on the second insulating layer 520 and the light emitting element 350, are the same as those having been described above with reference to FIG. 4. Therefore, a detailed description thereof will be omitted.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

The invention claimed is:
1. A display device, comprising:
a first electrode;
a second electrode spaced apart from the first electrode and to face the first electrode;
a first insulating layer covering the first electrode and the second electrode;
a second insulating layer on the first insulating layer, and exposing a region where the first electrode overlaps the first insulating layer and the second electrode overlaps the first insulating layer; and light emitting elements at the exposed part between the first electrode and the second electrode, wherein the second insulating layer defines openings exposing the first insulating layer and spaced apart from each other on a region where the first electrode and the second electrode face each other, and comprises a bridge portion between the openings, and wherein the light emitting elements are at one of the openings.

2. The display device of claim 1, wherein the openings are arranged in a first direction in which the first electrode extends, and are spaced apart.

3. The display device of claim 2, wherein the first insulating layer and the second insulating layer comprise materials having different etching selection ratios.

4. The display device of claim 3, wherein the second insulating layer comprises a first side region and a second side region on opposite sides of a center of one of the openings with respect to a second direction intersecting the first direction, and wherein the bridge portion connects the first and second side regions.

5. The display device of claim 4, wherein the bridge portion extends in the second direction.

6. The display device of claim 3, wherein the openings comprise a first opening, and a second opening spaced apart from the first opening in the first direction, and wherein the light emitting elements comprise a first light emitting element and a second light emitting element in the first opening, and a third light emitting element in the second opening.

7. The display device of claim 6, wherein the first light emitting element and the second light emitting element are spaced apart from each other.

8. The display device of claim 7, wherein a distance between the first light emitting element and the second light emitting element is shorter than a distance between the first light emitting element and the third light emitting element.

9. The display device of claim 8, wherein a density of the light emitting elements in the first opening and the second opening is higher than a density of the light emitting elements in the bridge portion between the first opening and the second opening.

10. The display device of claim 3, wherein one of the openings overlaps side portions where the first electrode and the second electrode face each other.

11. The display device of claim 10, wherein a center of one of the openings is closer to the first electrode than the second electrode, and wherein a first overlap portion where the first electrode overlaps one of the openings is larger than a second overlap portion where the second electrode overlaps the one of the openings.

12. The display device of claim 10, wherein a width of one of the openings in a second direction intersecting the first direction is shorter than a distance between centers of the first electrode and the second electrode, and is longer than a distance between side portions of the first electrode and the second electrode that face each other.

13. The display device of claim 12, wherein a width at a center of one of the openings in the first direction is shorter than a width at either end of one of the openings in the first direction.

14. The display device of claim 13, wherein a width of one of the openings in the second direction is longer than a length of a long axis of one of the light emitting elements.

15. The display device of claim 2, wherein the first electrode comprises a first electrode connection portion, and a first electrode counter portion connected to the first electrode connection portion and having a circular shape, and wherein the second electrode comprises a second electrode counter portion spaced from the first electrode counter portion to surround an outer surface thereof, and a second electrode connection portion connected to the second electrode counter portion.

16. The display device of claim 15, wherein one of the light emitting elements is between the first electrode counter portion and the second electrode counter portion, and has one end on the second electrode counter portion, and another end on the first electrode counter portion.

17. A display device, comprising:

a first electrode stem portion and a second electrode stem portion extending in a first direction and spaced apart from each other;

at least one first electrode branch portion branched from the first electrode stem portion and extending in a second direction intersecting the first direction;

a second electrode branch portion branched from the second electrode stem portion and extending in the second direction;

a first insulating layer covering the first electrode branch portion and the second electrode branch portion;

a second insulating layer on the first insulating layer and exposing a region where the first electrode branch portion and the second electrode branch portion overlap the first insulating layer;

a light emitting element at the exposed part between the first electrode branch portion and the second electrode branch portion; and a first contact electrode contacting the first electrode branch portion and one end of the light emitting element, and a second contact electrode contacting the second electrode branch portion and another end of the light emitting element, wherein the second insulating layer defines openings exposing the first insulating layer and spaced apart from each other on a region where the first electrode branch portion and the second electrode branch portion face each other, and a bridge portion between one of the openings, and wherein the light emitting element corresponds to one of the openings.

18. The display device of claim 17, wherein the first insulating layer and the second insulating layer comprises materials having different etching selection ratios.

19. The display device of claim 18, wherein the first insulating layer and the second insulating layer are patterned in a region spaced apart from both ends of one of the openings to expose the first electrode branch portion and the second electrode branch portion, and wherein the first contact electrode and the second contact electrode are in contact with the exposed first electrode branch portion and second electrode branch portion, respectively.

20. The display device of claim 19, wherein a first end of the light emitting element is electrically connected to the first electrode branch portion, a second end of the light emitting element is electrically connected to the second electrode branch portion, the first end of the light emitting element comprises an n-type conductive semiconductor, and the second end of the light emitting element comprises a p-type conductive semiconductor.

\* \* \* \* \*